(12) United States Patent
Ha et al.

(10) Patent No.: US 9,673,300 B2
(45) Date of Patent: Jun. 6, 2017

(54) SEMICONDUCTOR DEVICES INCLUDING A GATE CORE AND A FIN ACTIVE CORE AND METHODS OF FABRICATING THE SAME

(71) Applicants: Seungseok Ha, Hwaseong-si (KR); Keunhee Bai, Suwon-si (KR); Kyounghwan Yeo, Seoul (KR); Eunsil Park, Suwon-si (KR); Heonjong Shin, Yongin-si (KR)

(72) Inventors: Seungseok Ha, Hwaseong-si (KR); Keunhee Bai, Suwon-si (KR); Kyounghwan Yeo, Seoul (KR); Eunsil Park, Suwon-si (KR); Heonjong Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 20 days.

(21) Appl. No.: 14/820,860

(22) Filed: Aug. 7, 2015

(65) Prior Publication Data
US 2016/0111524 A1    Apr. 21, 2016

(30) Foreign Application Priority Data
Oct. 17, 2014  (KR) .......................... 10-2014-0140977

(51) Int. Cl.
*H01L 21/762*  (2006.01)
*H01L 29/66*  (2006.01)

(52) U.S. Cl.
CPC .. *H01L 29/66795* (2013.01); *H01L 21/76229* (2013.01); *H01L 29/66545* (2013.01)

(58) Field of Classification Search
CPC ....... H01L 29/66484; H01L 2029/7858; H01L 21/28282; H01L 21/823431; H01L 21/823821; H01L 21/845; H01L 27/0886; H01L 27/0924; H01L 27/10826; H01L 21/10879; H01L 27/1211; H01L 29/41791; H01L 29/66795; H01L 29/668
See application file for complete search history.

(56) References Cited

U.S. PATENT DOCUMENTS

| 8,609,510 | B1 | 12/2013 | Banna et al. |
| 8,735,991 | B2 | 5/2014 | Shieh et al. |
| 8,871,597 | B2 | 10/2014 | Shieh et al. |

(Continued)

FOREIGN PATENT DOCUMENTS

| KR | 1020130061616 A | 6/2013 |
| KR | 1020130086272 A | 8/2013 |

*Primary Examiner* — Julio J Maldonado
*Assistant Examiner* — Stanetta Issac
(74) *Attorney, Agent, or Firm* — Myers Bigel, P.A.

(57) ABSTRACT

Semiconductor devices and methods of fabricating the same are provided. The methods may include forming an isolation region defining a fin active region, forming a sacrificial field gate pattern on the isolation region and forming a sacrificial fin gate pattern on the fin active region. The method may also include forming a field gate cut zone comprising a first recess exposing a surface of the isolation region and a fin active cut zone comprising a second recess exposing a surface of the fin active region, forming a fin active recess in the second recess of the fin active cut zone and forming a field gate core and a fin active core by forming an insulation material in the first recess of the field gate cut zone and the fin active recess, respectively.

20 Claims, 23 Drawing Sheets

(56) References Cited

U.S. PATENT DOCUMENTS

2013/0187206 A1    7/2013  Mor et al.
2014/0131816 A1    5/2014  Wang et al.
2014/0227857 A1*   8/2014  Youn ................ H01L 21/76229
                                                           438/427

* cited by examiner

SEMICONDUCTOR DEVICES INCLUDING A GATE CORE AND A FIN ACTIVE CORE AND METHODS OF FABRICATING THE SAME

CROSS-REFERENCE TO RELATED APPLICATION

This application claims priority under 35 U.S.C. §119 to Korean Patent Application No. 10-2014-0140977 filed on Oct. 17, 2014, the disclosure of which is hereby incorporated by reference in its entirety.

BACKGROUND

Embodiments of the inventive concept relate to semiconductor devices including a gate core and a fin active core and methods of fabricating the same.

In order to implement a logic circuit including a plurality of fin active regions in a semiconductor device, portions of gate electrodes and portions of fin active regions may be removed at predetermined locations using a fin active cutting process and/or a gate cutting process.

SUMMARY

Some embodiments of the inventive concept provide semiconductor devices including a gate core and a fin active core.

Some embodiments of the inventive concept provide a method of fabricating semiconductor devices including a gate core and a fin active core.

A method of fabricating a semiconductor device may include forming an isolation region defining a fin active region on a substrate, forming a sacrificial field gate pattern on the isolation region and forming a sacrificial fin gate pattern on the fin active region, forming a first interlayer insulating layer between the sacrificial field gate pattern and the sacrificial fin gate pattern, forming a field gate cut zone including a first recess exposing a surface of the isolation region by removing a first portion of the sacrificial field gate pattern and a fin active cut zone including a second recess exposing a surface of the fin active region by removing a first portion of the sacrificial fin gate pattern, forming a fin active recess by removing the fin active region exposed in the second recess of the fin active cut zone, forming a field gate core and a fin active core by forming an insulation material in the first recess of the field gate cut zone and the fin active recess, respectively, forming a field gate electrode opening by removing a second portion of the sacrificial field gate pattern and forming a fin gate electrode opening by removing a second portion of the sacrificial fin gate pattern and forming a field gate pattern in the field gate electrode opening and forming a fin gate pattern in the fin gate electrode opening.

In various embodiments, the method may also include forming a base insulating layer between the fin active region and the sacrificial fin gate pattern using a deposition process.

According to various embodiments, the forming of the isolation region may include forming a trench including a deep trench and a shallow trench in the substrate and forming a trench insulation material filling the deep trench and partially filling the shallow trench.

In various embodiments, the sacrificial field gate pattern and the sacrificial fin gate pattern may include polysilicon, the first interlayer insulating layer may include silicon oxide, and the field gate core and the fin active core may include silicon nitride.

In various embodiments, the method may also include forming a fin gate cut zone including a third recess by removing a third portion of the sacrificial fin gate pattern and forming a fin gate core by forming the insulation material in the third recess of the fin gate cut zone.

According to various embodiments, the method may also include forming a sacrificial dummy gate pattern on the isolation region, forming a dummy gate electrode opening by removing the sacrificial dummy gate pattern and forming a dummy gate pattern in the dummy gate electrode opening.

In various embodiments, the method may further include forming a sacrificial butting gate pattern overlapping both the isolation region and the fin active region, forming a butting gate electrode opening by removing the sacrificial butting gate pattern and forming a butting gate pattern in the butting gate electrode opening.

According to various embodiments, the method may further include forming a source/drain region in the fin active region adjacent the fin gate pattern, forming a contact pattern extending through the first interlayer insulating layer and connecting to the source/drain region, forming a second interlayer insulating layer on the contact pattern and forming a via pattern extending through the second interlayer insulating layer and connecting to the contact pattern.

In various embodiments, the forming of the source/drain region may include performing an epitaxial growth process. The contact pattern may include a silicide layer directly on the source/drain region, a contact barrier layer on the silicide layer, and a contact plug on the contact barrier layer.

A method of fabricating a semiconductor device may include forming an isolation region in a substrate. The substrate may include a field area and an active area, and the isolation region may define a fin active region in the active area. The method may also include forming a sacrificial first field gate pattern on the isolation region of the field area and forming a sacrificial first fin gate pattern and a sacrificial second fin gate pattern on the fin active region and the isolation region of the active area, forming a first field gate cut zone including a first recess exposing the isolation region by removing a portion of the sacrificial first field gate pattern and a fin gate cut zone including a second recess exposing the fin active region by removing a portion of the sacrificial second fin gate pattern, forming a fin active recess by removing a portion of the fin active region exposed in the second recess of the fin gate cut zone, forming a first field gate core, a fin gate core, and a fin active core in the first recess of the first field gate cut zone, the second recess of the fin gate cut zone, and the fin active recess, respectively. The first field gate core, the fin gate core, and the fin active core may include the same material. The method may further include forming a first fin gate electrode opening by removing a portion of the sacrificial first fin gate pattern and forming a first fin gate pattern in the first fin gate electrode opening.

In various embodiments, the method may further include forming a sacrificial second field gate pattern on the isolation region of the field area, forming a second field gate cut zone including a third recess by removing a portion of the sacrificial second field gate pattern and forming a second field gate core in the third recess of the second field gate cut zone.

According to various embodiments, the first field gate core, the fin gate core, and the fin active core may include silicon nitride, and the second field gate core may include silicon oxide.

In various embodiments, the method may also include forming a sacrificial dummy field gate pattern on the isolation region of the field area, forming a dummy field gate electrode opening by removing the sacrificial dummy field gate pattern and forming a dummy field gate pattern in the dummy field gate electrode opening.

According to various embodiments, the method may further include forming a sacrificial butting gate pattern on the isolation region and the fin active region of the active area, forming a butting gate electrode opening by removing the sacrificial butting gate pattern and forming a butting gate pattern in the butting gate electrode opening.

In various embodiments, upper surfaces of the first field gate core, the fin gate core, the fin active core, and the first fin gate pattern may be coplanar.

A semiconductor device may include an isolation region defining a fin active region in a substrate, a first cut field gate pattern on the isolation region and a first fin gate pattern on the fin active region. The first cut field gate pattern may include an insulating first cut field gate core and a conductive first cut field gate electrode. The first fin gate pattern may include an insulating first fin gate core and a conductive first fin gate electrode. An upper surface of the first cut field gate core and an upper surface of the first fin gate core may be coplanar.

In various embodiments, the first cut field gate pattern further may include a first cut field gate barrier layer surrounding side surfaces and a lower surface of the first cut field gate electrode, a first cut field gate insulating layer surrounding side surfaces and a lower surface of the first cut field gate barrier layer and first cut field gate spacers on side surfaces of the first cut field gate core and on the side surfaces of the first cut field gate barrier layer. Upper surfaces of the first cut field gate core, the first cut field gate insulating layer, the first cut field gate barrier layer, the first cut field gate electrode, and the first cut field gate spacers may be coplanar.

According to various embodiments, the device may further include a second cut field gate pattern having an upper surface which is coplanar with the upper surface of the first cut field gate pattern on the isolation region. The second cut field gate pattern may include an insulating second cut field gate core, a conductive second cut field gate electrode, a second cut field gate barrier layer on side surfaces and a lower surface of the second cut field gate electrode, a second cut field gate insulating layer on side surfaces and a lower surface of the second cut field gate barrier layer and second cut field gate spacers on side surfaces of the second cut field gate core and on the side surfaces of the second cut field gate barrier layer.

In various embodiments, the first fin gate pattern further may include a first fin gate barrier layer surrounding side surfaces and a lower surface of the first fin gate electrode, a first fin gate insulating layer surrounding side surfaces and a lower surface of the first fin gate barrier layer and first fin gate spacers on side surfaces of the first fin gate core and on the side surfaces of the first fin gate barrier layer. Upper surfaces of the first fin gate core, the first fin gate insulating layer, the first fin gate barrier layer, the first fin gate electrode, and the first fin gate spacers may be coplanar.

According to various embodiments, the device may further include a second fin gate pattern having an upper surface which is coplanar with the upper surface of the first fin gate pattern on the fin active region. The second fin gate pattern may include an insulating second fin gate core, a conductive second fin gate electrode, a second fin gate barrier layer on side surfaces and a lower surface of the second fin gate electrode, a second fin gate insulating layer on side surfaces and a lower surface of the second fin gate barrier layer and second fin gate spacers on side surfaces of the second fin gate core and on the side surfaces of the second fin gate barrier layer.

In various embodiments, the fin active region which overlaps the second fin gate core may include an insulating fin active core in a fin active recess.

In various embodiments, a lower surface of the first fin gate core may protrude into the isolation region to be lower than a lower surface of the first cut field gate insulating layer.

A semiconductor device may include a substrate including a field area including an isolation region and an active area including a fin active region defined by the isolation region. The fin active region may extend in an X direction. The device may also include a first cut field gate pattern extending in a Y direction on the isolation region of the field area, a field gate cut-zone extending in the X direction and crossing the first cut field gate pattern, a fin gate pattern extending in the Y direction and crossing the fin active region and the isolation region in the active area, a fin gate cut-zone extending in the X direction and crossing the fin gate pattern and a fin active cut-zone extending in the Y direction and overlapping a portion of the fin gate pattern. The Y direction may be different from the X direction. The first cut field gate pattern may include an insulating first cut field gate core in a region which overlaps the field gate cut-zone and a conductive first cut field gate electrode in a region which does not overlap the field gate cut-zone. The fin gate pattern may include an insulating fin gate core in a region which overlaps the fin gate cut-zone, an insulating fin active core in a region which overlaps the fin active cut-zone and a conductive fin gate electrode in a region which does not overlap the fin gate cut-zone and the fin active cut-zone.

In various embodiments, the device may further include a second cut field gate pattern that extends parallel to the first cut field gate pattern on the isolation region of the field area. The second cut field gate pattern may include an insulating second cut field gate core in a region which overlaps the field gate cut-zone and a conductive second cut field gate electrode in a region which does not overlap the field gate cut-zone, the first cut field gate core may include the same material as the fin active core, and the second cut field gate core may include a material different from the fin active core.

According to various embodiments, the device may further include a dummy field gate pattern that extends parallel to the first cut field gate pattern and does not to overlap the field gate cut-zone. The dummy field gate pattern may include a dummy gate insulating layer on the isolation region, a dummy gate barrier layer on the dummy gate insulating layer and a dummy gate electrode on the dummy gate barrier layer.

In various embodiments, the device may further include a butting gate pattern that crosses one end of the fin active region in the active area and does not to overlap the fin active cut-zone. The butting gate pattern may include an insulating butting gate core in a region which overlaps the fin gate cut-zone and a conductive butting gate electrode in a region which does not overlap the fin gate cut-zone.

According to various embodiments, upper surfaces of the first cut field gate core, the fin gate core, and the fin active core may be coplanar.

In various embodiments, the device may further include a source/drain region in the fin active region adjacent the fin gate pattern. The source/drain region may protrude from a surface of the fin active region, and the source/drain region may include one of a silicon germanium (SiGe) layer, a silicon carbide (SiC) layer, or a silicon (Si) layer, which is formed by an epitaxial growth process.

In various embodiments, the device may further include a contact pattern on the source/drain region. The contact pattern may include a silicide layer directly on the source/drain region, a contact barrier layer on the silicide layer and a contact plug on the contact barrier layer.

According to various embodiments, the device may also include a via pattern on the contact pattern. The via pattern may include a via barrier layer on the contact pattern and a via plug on the via barrier layer.

A method of fabricating a semiconductor device may include forming a fin active region in a first region of a substrate. The substrate may include the first region and a second region. The method may also include forming an isolation region in the first region and the second region of the substrate. The isolation region may be adjacent the fin active region. The method may further include forming a first gate line in the first region of the substrate, forming a second gate line extending on the isolation region in the second region of the substrate, concurrently removing a portion of the first gate line disposed on the fin active region to form a first recess in the first gate line and a portion of the second gate line to form a second recess in the second gate line, removing a portion of the fin active region exposed by the first recess of the first gate line to form a third recess in the fin active region and forming a first insulating core pattern in the first and third recesses and a second insulating core pattern in the second recess. The first gate line may traverse the fin active region and may extend on the isolation region.

In various embodiments, the method may further include forming a third gate line in the first region of the substrate, removing a portion of the third gate line disposed on the isolation region to form a fourth recess in the third gate line concurrently with removing the portion of the first gate line to form the first recess and the portion of the second gate line to form the second recess and forming a third insulating core pattern in the third recess. The third gate line may traverse the fin active region and the isolation region.

According to various embodiments, upper surfaces of the first, second and third insulating core patterns may be coplanar.

In various embodiments, the first and second insulating core patterns may include silicon nitride.

According to various embodiments, the method may also include forming a source/drain region in the fin active region adjacent a side of the first gate line before concurrently removing the portion of the first gate line and the portion of the second gate line.

BRIEF DESCRIPTION OF THE DRAWINGS

The foregoing and other features and advantages of the inventive concept will be apparent from the more particular description of some embodiments of the inventive concept, as illustrated in the accompanying drawings. In the drawings:

FIGS. 3A to 14C are cross-sectional views describing a method of fabricating a semiconductor device in accordance with some embodiments of the inventive concept. FIGS. 3A, 4A, 5A, 6A, 7A, 8A, 9A, 10A, 11A, 12A, 13A and 14A are cross-sectional views taken along the line I-I' of FIG. 1, FIGS. 3B, 4B, 5B, 6B, 7B, 8B, 9B, 10B, 11B, 12B, 13B and 14B are cross-sectional views taken along the line II-II' of FIG. 1, and FIGS. 3C, 4C, 5C, 6C, 7C, 8C, 9C, 10C, 11C, 12C, 13C and 14C are cross-sectional views taken along the line III-III' of FIG. 1;

DETAILED DESCRIPTION OF THE EMBODIMENTS

Figure 1:
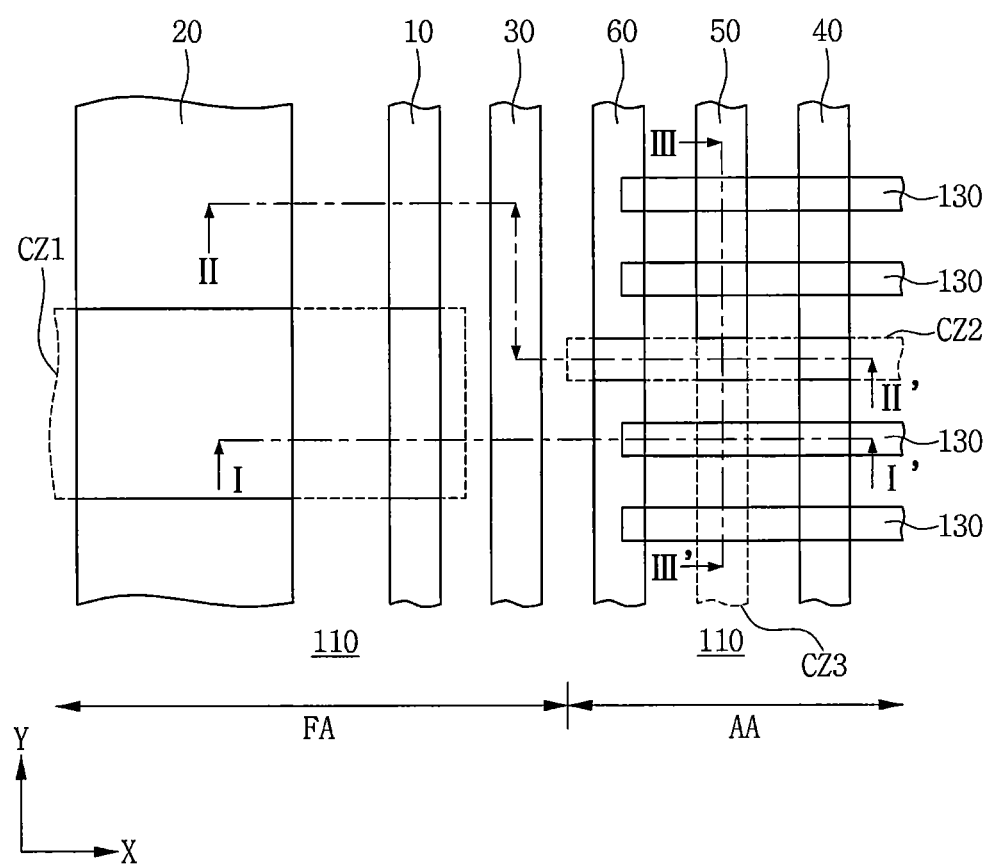
FIG. 1 is a layout of a semiconductor device in accordance with some embodiments of the inventive concept.

Various embodiments will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The example embodiments of the inventive concept will be described with reference to cross-sectional views and/or plan views, which are ideal views. Thicknesses of layers and areas are exaggerated for effective description of the technical contents in the drawings. Forms of the embodiments may be modified by the manufacturing technology and/or tolerance. Therefore, the embodiments of the inventive concept are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device and are not intended to be limited to the scope of the inventive concept.

Hereinafter, like reference numerals in the drawings denote like elements throughout the specification. Therefore, although like reference numerals or similar reference numerals are not mentioned or described in the drawing, it will be described with reference to the other drawings. Further, although reference numerals are not illustrated, it will be described with reference to the other drawings.

FIG. 1 is a layout of a semiconductor device in accordance with some embodiments of the inventive concept.

Referring to FIG. 1, the semiconductor device in accordance with some embodiments of the inventive concept may include an insulating field area FA and a conductive active area AA.

The field area FA may include field gate lines 10, 20, and 30 which extend in a Y direction on an isolation region 110.

The field gate lines 10, 20, and 30 may include cut field gate lines 10 and 20 and a dummy field gate line 30. The cut field gate lines 10 and 20 may include a first cut field gate line 10 which has a relatively narrow width and a second cut field gate line 20 which has a relatively wide width. The cut field gate lines 10 and 20 each may be separated by a field gate cut-zone CZ1 that overlaps the cut field gate lines 10 and 20.

The field gate cut-zone CZ1 may separate each of the cut field gate lines 10 and 20 and may extend in an X direction. The dummy field gate line 30 may continuously extend in the Y direction without being separated by the field gate cut-zone CZ1.

The active area AA may include fin active regions 130, which extend in parallel in the X direction, the isolation region 110, and a first fin gate line 40, a second fin gate line 50, and a butting gate line 60. The first fin gate line 40, the second fin gate line 50 and the butting gate line 60 extend in the Y direction to cross the fin active regions 130 and the isolation region 110.

The fin active regions 130 and the isolation region 110 may be alternately disposed in the Y direction.

The butting gate line 60 may partially overlap and cross one end portion of each fin active regions 130 and the isolation region 110. For example, the butting gate line 60 may not completely cross the fin active regions 130.

The first and second fin gate lines 40 and 50 and the butting gate line 60 each may be separated by a fin gate cut-zone CZ2 that overlaps the first and second fin gate lines 40 and 50 and the butting gate line 60. The fin gate cut-zone CZ2 may extend in the X direction and separate the first and second fin gate lines 40 and 50 and the butting gate line 60.

Some of the fin active regions 130 may be separated by a fin active cut-zone CZ3 that overlaps the some of the fin active regions 130. The fin active cut-zone CZ3 may overlap a portion of the second fin gate line 50, may extend in the Y direction, and may separate the some of the fin active regions 130. The second fin gate line 50 may not extend or may not be formed in the fin active cut-zone CZ3. For example, a portion of the second fin gate line 50, which overlaps the fin active cut-zone CZ3, is removed and is not formed.

The fin gate cut-zone CZ2 and the fin active cut-zone CZ3 may partially overlap. Alternatively, the fin gate cut-zone CZ2 and the fin active cut-zone CZ3 may be merged as one cut-zone.

Figure 2A:
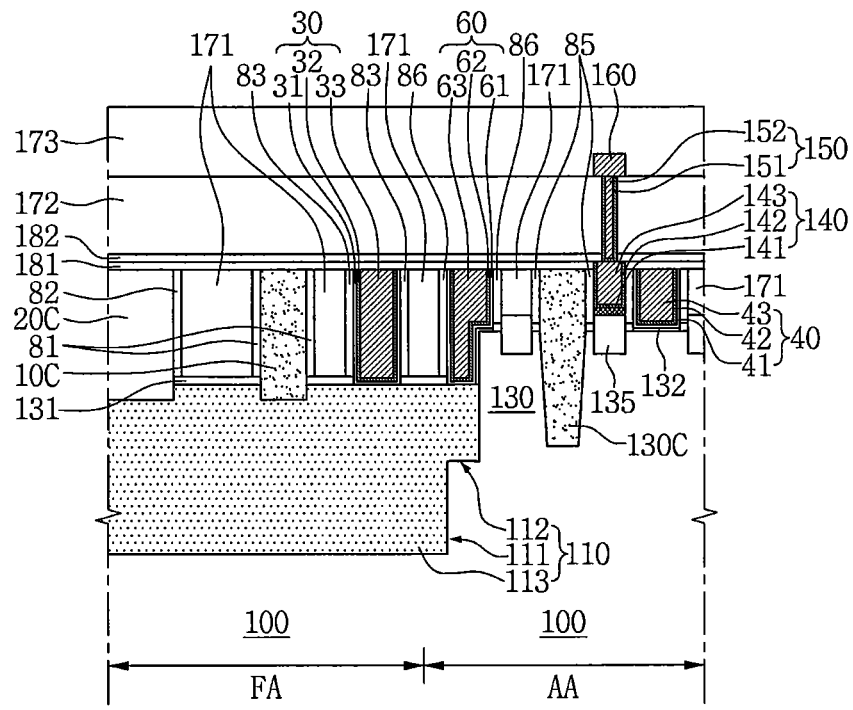
FIGS. 2A to 2C are cross-sectional views of a semiconductor device taken along the lines I-I', II-II' and III-III' of FIG. 1 in accordance with some embodiments of the inventive concept.
Figure 2B:
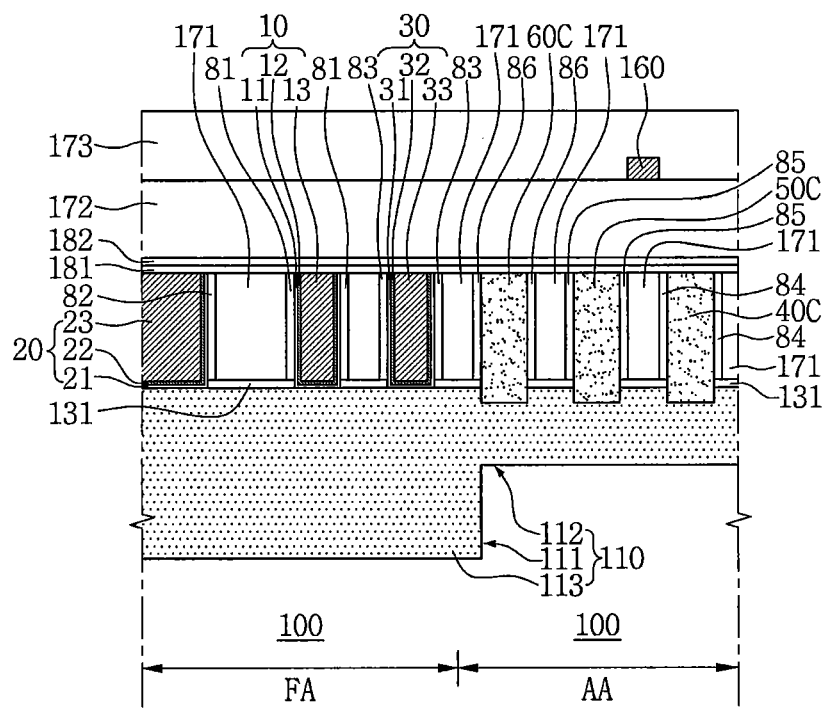
Figure 2C:
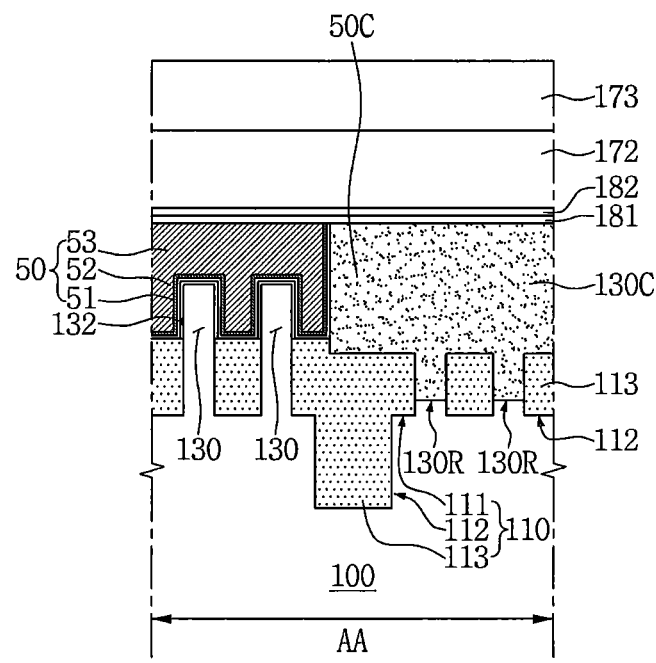

FIGS. 2A to 2C are cross-sectional views of a semiconductor device taken along the lines I-I', II-II', and III-III' of FIG. 1 in accordance with some embodiments of the inventive concept. The gate "lines" 10, 20, 30, 40, 50, and 60 of FIG. 1 will be described as gate "patterns."

Referring to FIGS. 2A to 2C, the semiconductor device in accordance with some embodiments of the inventive concept may include an isolation region 110 formed in a substrate 100 including a field area FA and an active area AA, and a fin active region 130 defined by the isolation region 110.

The substrate 100 may include a silicon wafer.

The isolation region 110 may include a deep trench 111, a shallow trench 112, and a trench insulation material 113 which completely fills the deep trench 111 and partially fills the shallow trench 112. The trench insulation material 113 may include, for example, silicon oxide. The fin active region 130 may protrude upward beyond an upper surface of the isolation region 110. The fin active region 130 may be a portion of the substrate 100.

A surface insulating layer 132 may be formed on the fin active region 130. The surface insulating layer 132 may include, for example, oxidized silicon formed by oxidation of a surface of the fin active region 130.

The semiconductor device may include cut field gate patterns 10 and 20, and a dummy field gate pattern 30, which are formed on the isolation region 110 of the field area FA. The cut field gate patterns 10 and 20 may include a first cut field gate pattern 10 which has a relatively narrow width and a second cut field gate pattern 20 which has a relatively wide width. As described with reference to FIG. 1, each of the first and second cut field gate patterns 10 and 20 may be separated by the field gate cut-zone CZ1 that overlaps the first and second cut field gate patterns 10 and 20.

The semiconductor device may include a first fin gate pattern 40, a second fin gate pattern 50, and a butting gate pattern 60, which are disposed on the isolation region 110 and the fin active region 130 of the active area AA. As described with reference to FIG. 1, each of the first and second fin gate patterns 40 and 50 and the butting gate pattern 60 may be separated by the fin gate cut-zone CZ2 that overlaps the first and second fin gate patterns 40 and 50 and the butting gate pattern 60, and a portion of the second fin gate pattern 50 may be removed by the fin active cut-zone CZ3 that overlaps the portion of the second fin gate pattern 50.

Referring to FIG. 2A, the first cut field gate pattern 10 may include a first cut field gate core 10C, and the second cut field gate pattern 20 may include a second cut field gate core 20C, in a region which overlaps the field gate cut-zone CZ1 of FIG. 1. Bottoms of the first cut field gate core 10C and the second cut field gate core 20C may protrude into the isolation region 110. For example, the first cut field gate core 10C may include silicon nitride and the second cut field gate core 20C may include silicon oxide.

The first fin gate pattern 40 may include a first fin gate insulating layer 41, a first fin gate barrier layer 42, and a first fin gate electrode 43, and the butting gate pattern 60 may include a butting gate insulating layer 61, a butting gate barrier layer 62, and a butting gate electrode 63 in a region which does not overlap the fin gate cut-zone CZ2 of FIG. 1. The semiconductor device may include a fin active core 130C in a fin active recess 130R. The fin active core 130C may include, for example, silicon nitride.

The semiconductor device may further include source/drain regions 135 which protrude from a surface of the fin active region 130 and protrude into the fin active region 130. The source/drain regions 135 are adjacent the fin gate patterns 40 and 50 in the fin active region 130. The source/drain regions 135 may include, for example, silicon germanium (SiGe), silicon carbide (SiC), or silicon (Si), which is formed by an epitaxial growth process.

The semiconductor device may further include a first interlayer insulating layer 171 which fills gaps between the first cut field gate pattern 10, the second cut field gate pattern 20, the dummy field gate pattern 30, the first fin gate pattern 40, the second fin gate pattern 50, and the butting gate pattern 60. Upper surfaces of the first cut field gate pattern 10, the second cut field gate pattern 20, the dummy field gate pattern 30, the first fin gate pattern 40, the second fin gate pattern 50, the butting gate pattern 60, and the first interlayer insulating layer 171 may be coplanar. The first interlayer insulating layer 171 may include, for example, silicon oxide.

The semiconductor device may further include a first stopper layer 181, which is formed on the first cut field gate pattern 10, the second cut field gate pattern 20, the dummy field gate pattern 30, the first fin gate pattern 40, the second fin gate pattern 50, the butting gate pattern 60, and the first interlayer insulating layer 171. The first stopper layer 181 may be formed to extend horizontal and to be flat. The first stopper layer 181 may include silicon nitride.

The semiconductor device may further include a contact pattern 140 that connects to the source/drain region 135 and vertically extends through the first stopper layer 181 and the first interlayer insulating layer 171. The contact pattern 140 may include a silicide layer 141, a contact barrier layer 142, and a contact plug 143 and the contact pattern 140 may be directly formed on the source/drain region 135. The silicide layer 141 may include a metal silicide such as tungsten silicide (WSi), titanium silicide (TiSi), nickel silicide (NiSi), or cobalt silicide (CoSi). The contact barrier layer 142 may include a barrier metal such as titanium nitride (TiN). The contact plug 143 may include a metal such as tungsten (W). Upper surfaces of the contact pattern 140 and the first stopper layer 181 may be coplanar. The semiconductor device may further include a second stopper layer 182, which is formed on the contact pattern 140 and the first stopper layer 181. The second stopper layer 182 may include, for example, silicon nitride.

The semiconductor device may further include a second interlayer insulating layer 172 formed on the second stopper layer 182. The second interlayer insulating layer 172 may include, for example, silicon oxide.

The semiconductor device may further include a via pattern 150 which contacts the contact pattern 140 and vertically extends through the second interlayer insulating layer 172 and the second stopper layer 182. The via pattern 150 may include a via barrier layer 151 and a via plug 152. The via barrier layer 151 may include a barrier metal such as titanium nitride (TiN). The via plug 152 may include a metal such as tungsten (W).

The semiconductor device may further include a metal interconnection 160, which is formed on the via pattern 150 and the second interlayer insulating layer 172. The metal interconnection 160 may horizontally extend. The metal interconnection 160 may include a metal such as tungsten (W).

The semiconductor device may further include a third interlayer insulating layer 173 which covers the metal interconnection 160 on the second interlayer insulating layer 172. The third interlayer insulating layer 173 may include silicon oxide or silicon nitride.

Referring to FIG. 2B, the first cut field gate pattern 10 may include a first cut field gate insulating layer 11, a first cut field gate barrier layer 12, and a first cut field gate electrode 13, and the second cut field gate pattern 20 may include a second cut field gate insulating layer 21, a second cut field gate barrier layer 22, and a second cut field gate electrode 23 in a region which does not overlap the field gate cut-zone CZ1 of FIG. 1.

The first fin gate pattern 40 may include a first fin gate core 40C, the second fin gate pattern 50 may include a second fin gate core 50C, and the butting gate pattern 60 may include a butting gate core 60C, in a region which overlaps the fin gate cut-zone CZ2 of FIG. 1.

Referring to FIG. 2C, the second fin gate pattern 50 may include a second fin gate insulating layer 51, a second fin gate barrier layer 52, and a second fin gate electrode 53, which are formed on the surface insulating layer 132 on surfaces of the protruding fin regions 130, in a region which does not overlap the fin active cut-zone CZ3 of FIG. 1, and may include a second fin gate core 50C and a fin active core 130C in a region which overlaps the fin active cut-zone CZ3 of FIG. 1. The second fin gate core 50C may include, for example, silicon nitride.

The first cut field gate insulating layer 11, the second cut field gate insulating layer 21, a dummy field gate insulating layer 31, the first fin gate insulating layer 41, the second fin gate insulating layer 51, and the butting gate insulating layer 61 each may include a metal oxide such as hafnium oxide (HfO), aluminum oxide (AlO), or titanium oxide (TiO).

The first cut field gate barrier layer 12, the second cut field gate barrier layer 22, a dummy field gate barrier layer 32, the first fin gate barrier layer 42, the second fin gate barrier layer 52, and the butting gate barrier layer 62 each may include a barrier metal such as titanium nitride (TiN) or tantalum nitride (TaN).

The first cut field gate electrode 13, the second cut field gate electrode 23, a dummy field gate electrode 33, the first fin gate electrode 43, the second fin gate electrode 53, and the butting gate electrode 63 each may include tungsten (W), copper (Cu), aluminum (Al) or another metal.

The semiconductor device may include first cut field gate spacers 81 on side surfaces of the first cut field gate pattern 10, a second cut field gate spacer 82 on a side surface of the second cut field gate pattern 20, dummy field gate spacers 83 on side surfaces of the dummy field gate pattern 30, first fin gate spacers 84 on side surfaces of the first fin gate pattern 40, second fin gate spacers 85 on side surfaces of the second fin gate pattern 50, and butting gate spacers 86 on side surfaces of the butting gate pattern 60.

The first cut field gate spacers 81 may be formed on side surfaces of the first cut field gate insulating layer 11 and the first cut field gate core 10C. The second cut field gate spacer 82 may be formed on side surfaces of the second cut field gate insulating layer 21 and the second cut field gate core 20C. The dummy field gate spacers 83 may be formed on side surfaces of the dummy field gate insulating layer 31. The first fin gate spacers 84 may be formed on side surfaces of the first fin gate insulating layer 41 and the first fin gate core 40C. The second fin gate spacers 85 may be formed on side surfaces of the second fin gate insulating layer 51, the second fin gate core 50C, and the fin active core 130C. The butting gate spacers 86 may be formed on side surfaces of the butting gate insulating layer 61 and the butting gate core 60C.

A base insulating layer 131 may be formed between the isolation region 110 and the first interlayer insulating layer 171, and between the isolation region 110 and the gate spacers 81, 82, 83, 84, 85, and 86. The base insulating layer 131 may include silicon oxide.

FIGS. 3A to 14C are cross-sectional views describing a method of a semiconductor device in accordance with some embodiments of the inventive concept. FIGS. 3A, 4A, 5A, 6A, 7A, 8A, 9A, 10A, 11A, 12A, 13A and 14A are cross-sectional views taken along the line I-I' of FIG. 1, FIGS. 3B, 4B, 5B, 6B, 7B, 8B, 9B, 10B, 11B, 12B, 13B and 14B are cross-sectional views taken along the line II-II' of FIG. 1, and FIGS. 3C, 4C, 5C, 6C, 7C, 8C, 9C, 10C, 11C, 12C, 13C and to 14C are cross-sectional views taken along the line III-III' of FIG. 1.

Figure 3A:
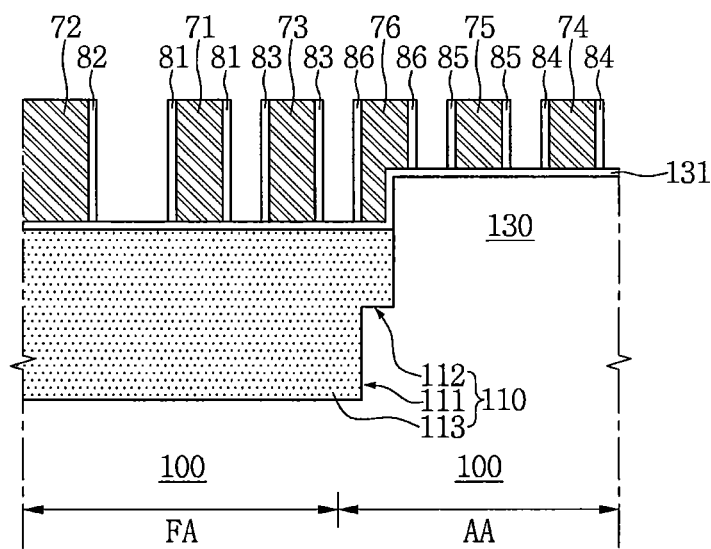
Figure 3B:
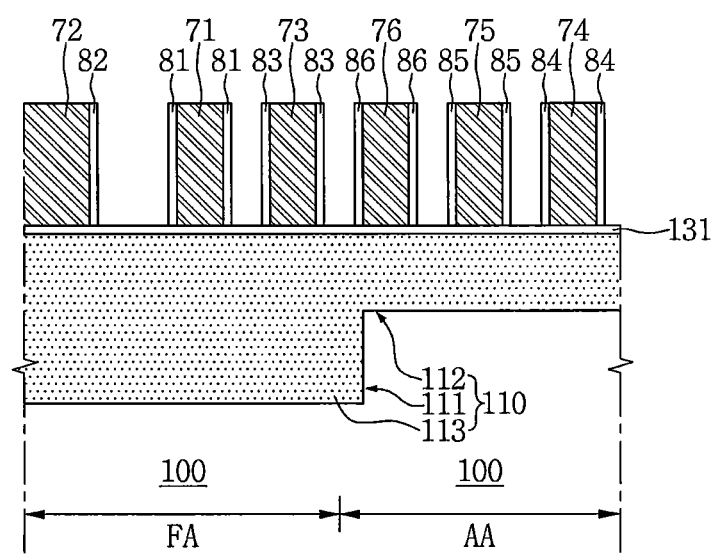
Figure 3C:
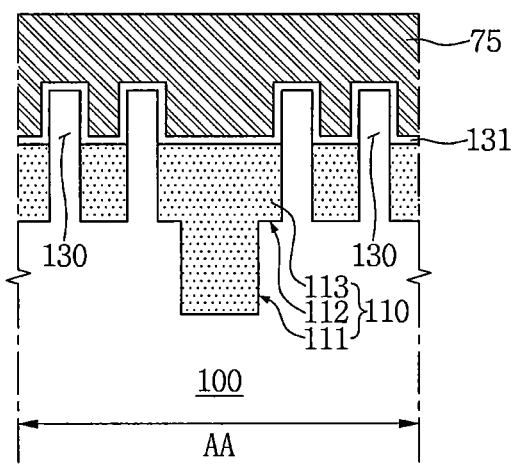

Referring to FIGS. 3A to 3C, the method of fabricating the semiconductor device in accordance with some embodiments of the inventive concept may include providing a substrate 100 including a field area FA and an active area AA, forming an isolation region 110 which defines a fin active region 130 on the substrate 100, forming a base insulating layer 131 on surfaces of the fin active region 130 and the isolation region 110, and forming sacrificial gate patterns 71 to 76 and gate spacers 81 to 86 on the base insulating layer 131.

The substrate 100 may include one of a single crystal silicon wafer, a silicon germanium (SiGe) wafer, and a silicon on insulator (SOI) wafer.

The isolation region 110 may include a trench insulation material 113 which fills a deep trench 111 and a shallow trench 112. The trench insulation material 113 may completely fill the deep trench 111, and partially fill the shallow trench 112. The trench insulation material 113 may include silicon oxide such as Tonen silazane (TOSZ) or un-doped silicate glass (USG).

The base insulating layer 131 may be conformally formed on the surfaces of the fin active region 130 and the isolation region 110 by performing a deposition process such as a chemical vapor deposition (CVD) process or an atomic layered deposition (ALD) process. The base insulating layer 131 may include silicon oxide.

The sacrificial gate patterns 71 to 76 may include a sacrificial first cut field gate pattern 71, a sacrificial second cut field gate pattern 72, a sacrificial dummy field gate pattern 73, a sacrificial first fin gate pattern 74, a sacrificial second fin gate pattern 75, and a sacrificial butting gate pattern 76. The sacrificial gate patterns 71 to 76 each may include, for example, polycrystalline silicon. The forming of the gate spacers 81 to 86 may include forming a silicon nitride layer by performing an ALD process, and then performing an etch-back process.

Figure 4A:
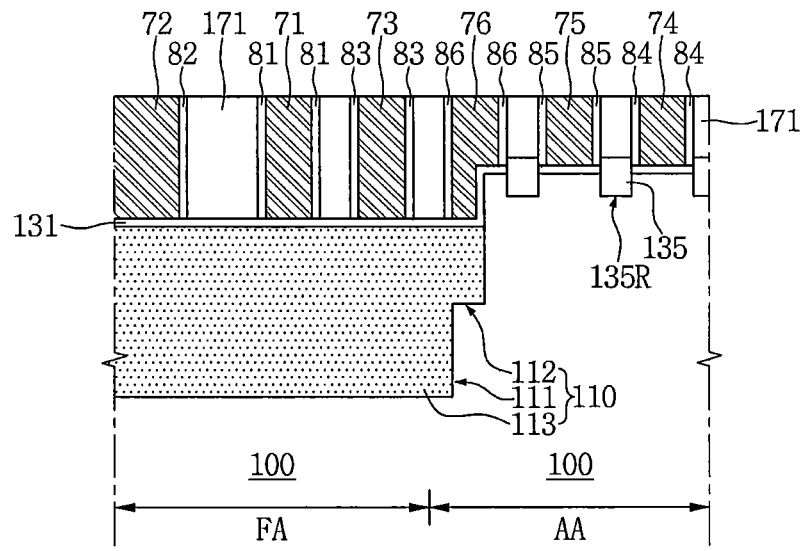
Figure 4B:
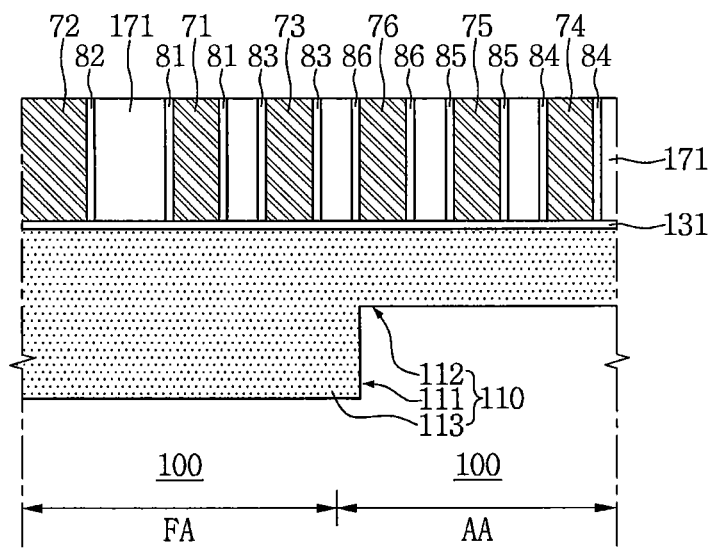
Figure 4C:
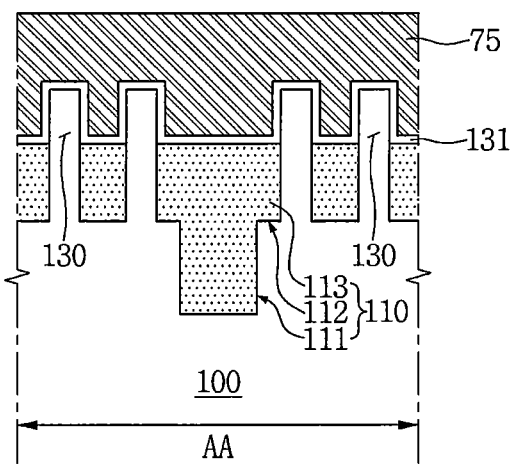

Referring to FIGS. 4A to 4C, the method may include forming source/drain regions 135 and forming a first interlayer insulating layer 171 between the sacrificial gate patterns 71 to 76.

The forming of the source/drain region 135 may include forming source/drain recesses 135R by removing the base insulating layer 131 and recessing the fin active region 130 between the sacrificial fin gate patterns 74 and 75 and between the sacrificial fin gate pattern 75 and the sacrificial butting gate pattern 76. The forming of the source/drain region 135 may also include performing a selectively epitaxial growth (SEG) process. The source/drain region 135 may include a silicon germanium (SiGe) layer, a silicon carbide (SiC) layer, or a silicon (Si) layer.

The forming of the first interlayer insulating layer 171 may include forming silicon oxide to cover the sacrificial gate patterns 71 to 76 and fill gaps between the sacrificial gate patterns 71 to 76 and performing a planarization process such as a chemical mechanical polishing (CMP) process or an etch-back process.

Figure 5A:
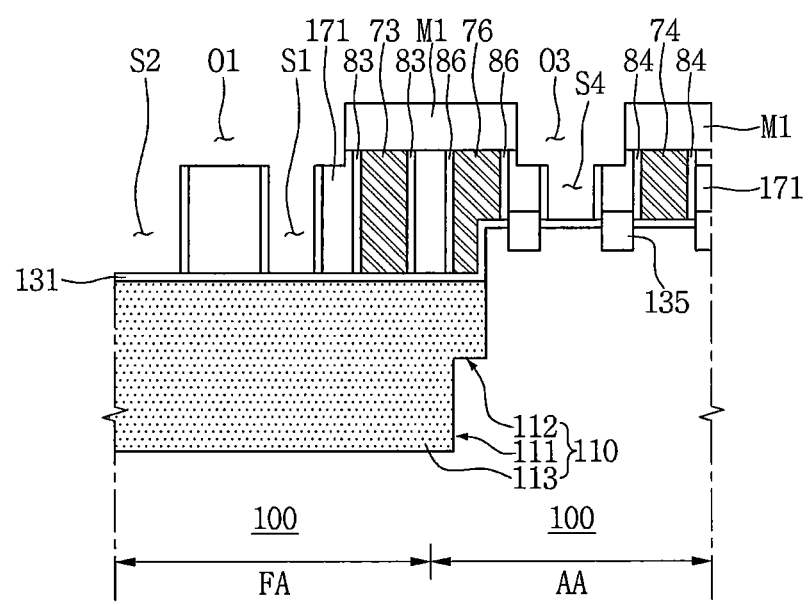
Figure 5B:
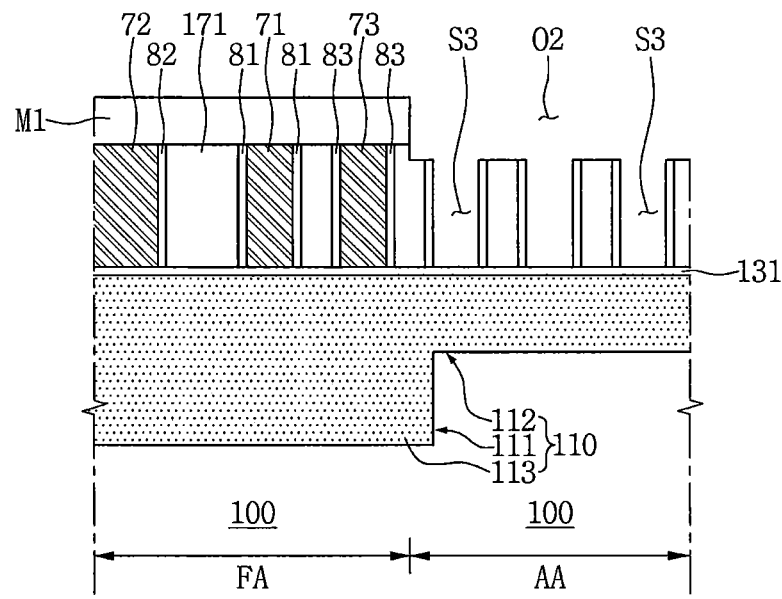
Figure 5C:
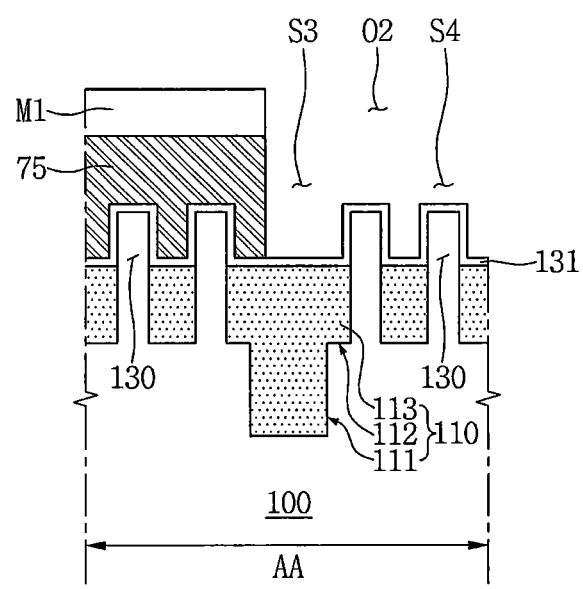

Referring to FIGS. 5A to 5C, the method may include forming a first mask pattern M1, and forming a first field gate cut space S1, a second field gate cut space S2, a fin gate cut space S3, and a fin active cut space S4 by removing portions of the sacrificial gate patterns 71 to 76 by performing a silicon etching process using the first mask pattern M1 as an etch mask. In some embodiments, the first field gate cut space S1, the second field gate cut space S2, the fin gate cut space S3, and the fin active cut space S4 may be formed concurrently through the same process. It will be understood that "formed concurrently" refers to formed in a same fabrication step, at approximately (but not necessarily exactly) the same time.

The first mask pattern M1 may include a field gate cut opening O1, a fin gate cut opening O2, and a fin active cut opening O3 corresponding to the field gate cut-zone CZ1, the fin gate cut-zone CZ2, and the fin active cut-zone CZ3 of FIG. 1, respectively.

The base insulating layer 131 may be exposed by removing the portions of the sacrificial first cut field gate pattern 71, the sacrificial second cut field gate pattern 72, the sacrificial first fin gate pattern 74, the sacrificial second fin gate pattern 75, and the sacrificial butting gate pattern 76, which are exposed in the field gate cut opening O1, the fin gate cut opening O2, and the fin active cut opening O3.

The first mask pattern M1 may include a hard mask. For example, the first mask pattern M1 may include silicon oxide, silicon nitride, or spin on hardmask (SOH).

Upper portions of the first interlayer insulating layer 171 and the gate spacers 81, 82, 84, 85, and 86, which are exposed in the field gate cut opening O1, the fin gate cut opening O2, and the fin active cut opening O3 may be recessed.

Figure 6A:
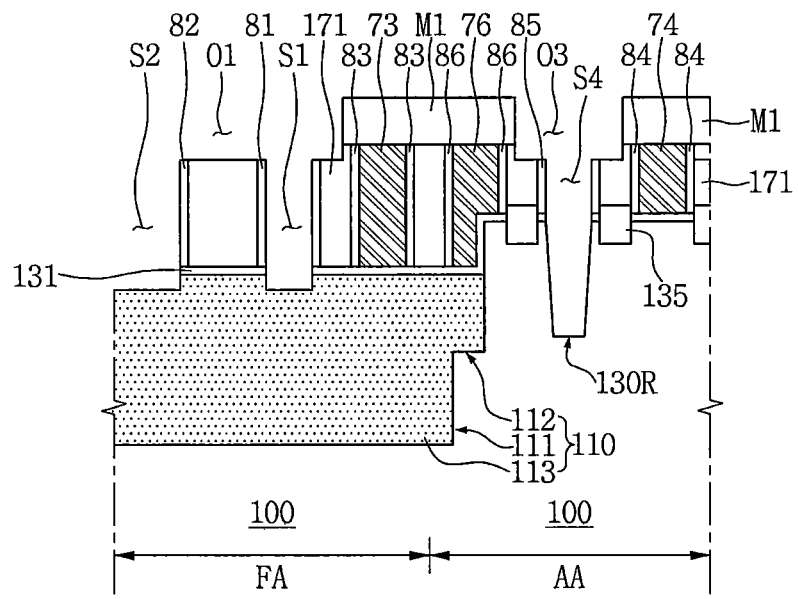
Figure 6B:
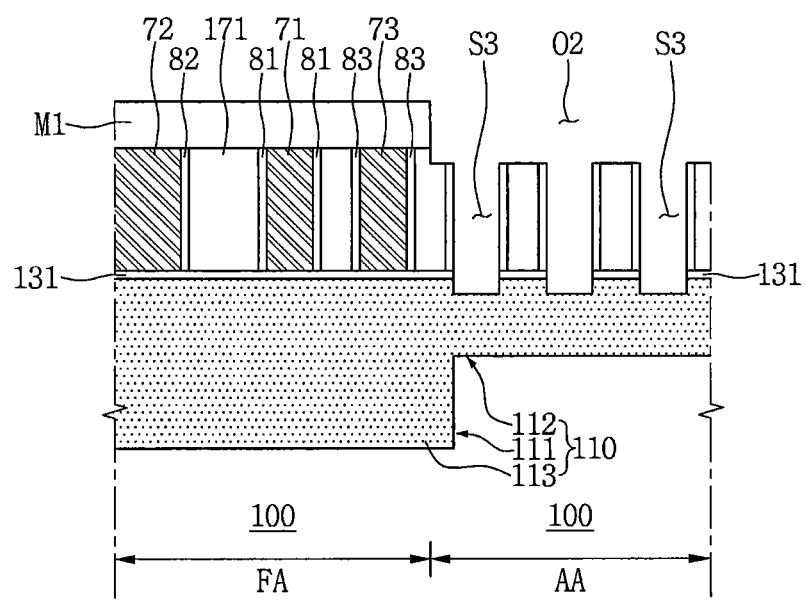
Figure 6C:
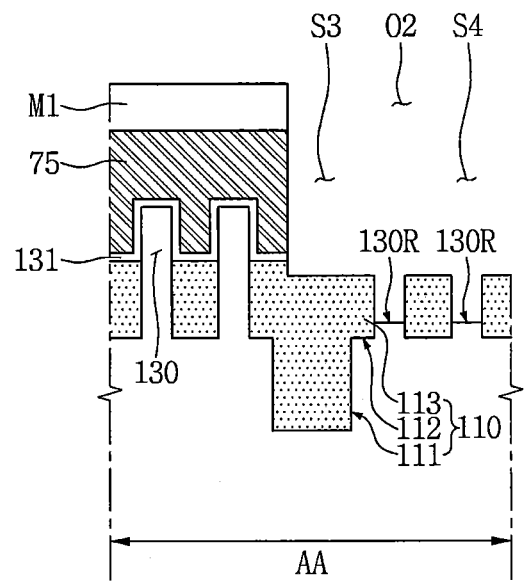

Referring to FIGS. 6A to 6C, the method may include forming a fin active recess 130R by removing the base insulating layer 131 exposed in the fin active cut space S4 and recessing the fin active region 130.

The isolation region 110 exposed in the first field gate cut space S1, the second field gate cut space S2, and the fin gate cut space S3 may be recessed.

Figure 7A:
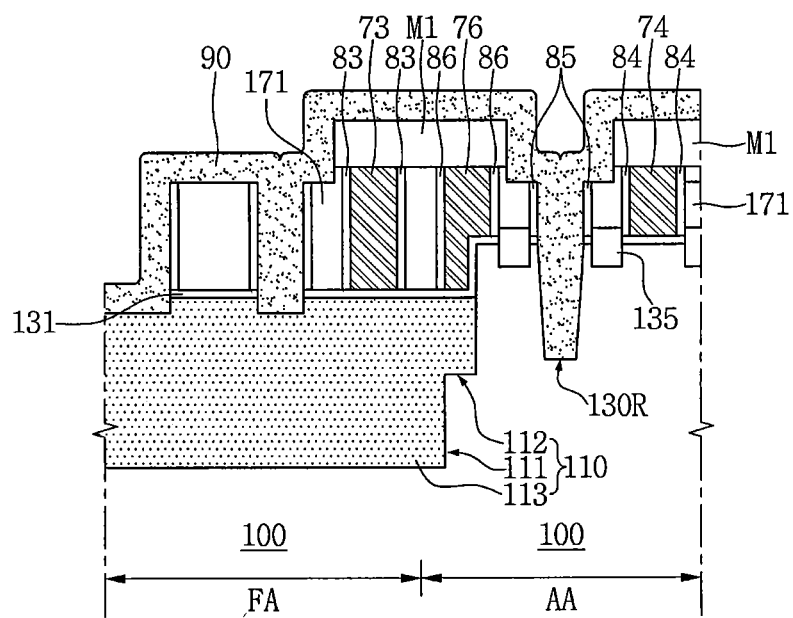
Figure 7B:
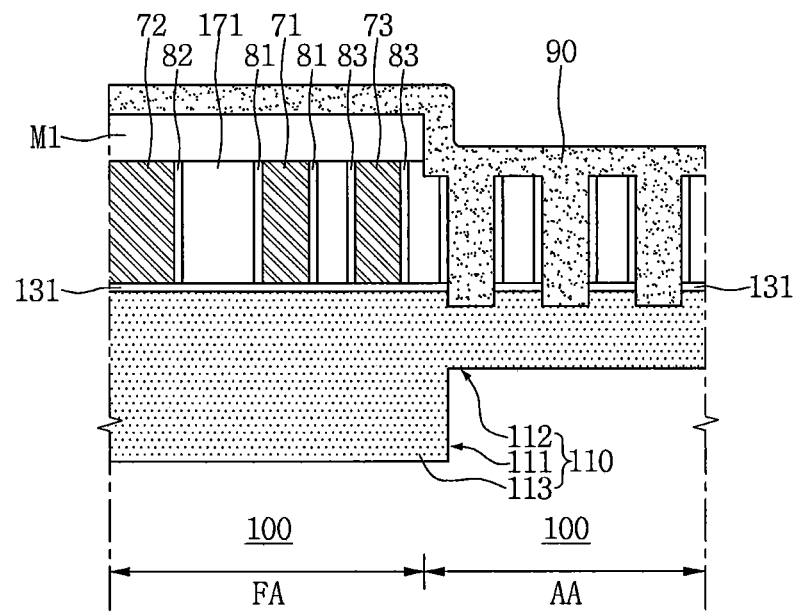
Figure 7C:
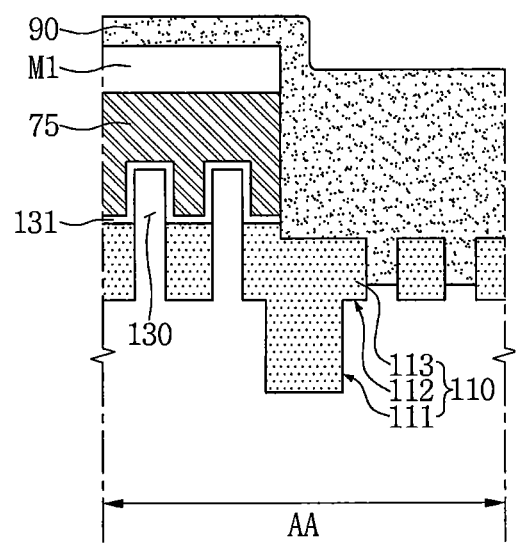

Referring to FIGS. 7A to 7C, the method may include forming an insulating core layer 90 which completely or partially fills the first and second field gate cut spaces S1 and S2, the fin gate cut space S3, the fin active cut space S4, and the fin active recess 130R. In some embodiments, the insulating core layer 90 may be formed semi-conformally.

For example, the first field gate cut space S1, the fin gate cut space S3, the fin active cut space S4, and the fin active recess 130R may be completely filled with the core layer 90, and the second field gate cut space S2 may be partially filled with the core layer 90. The core layer 90 may include, for example, silicon nitride.

Figure 8A:
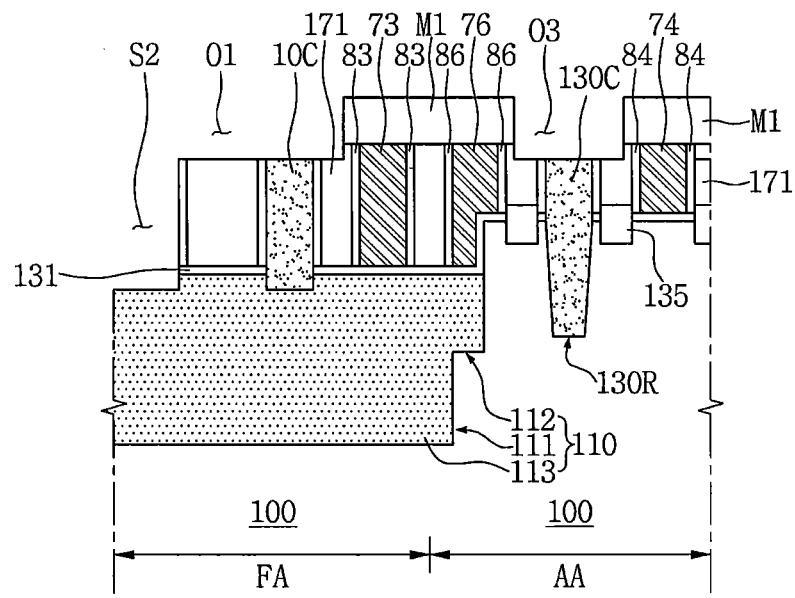
Figure 8B:
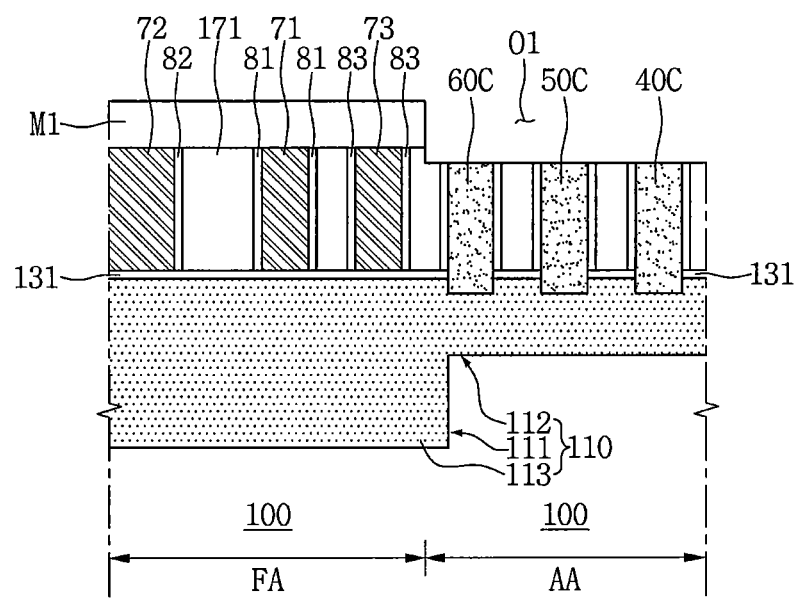
Figure 8C:
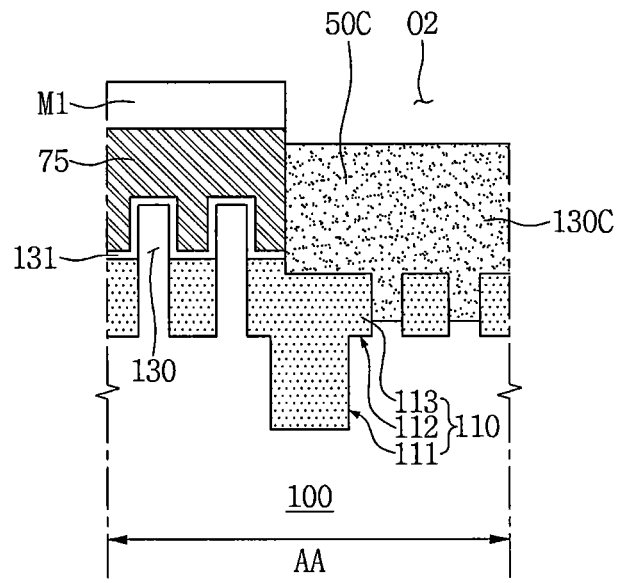

Referring to FIGS. 8A to 8C, the method may include forming a first cut field gate core 10C, a first fin gate core 40C, a second fin gate core 50C, a butting gate core 60C, and a fin active core 130C by partially removing the core layer 90 by performing a chamfering process.

The core layer 90 in the second field gate cut space S2 may be completely removed. The chamfering process may include an isotropic etch-back process. For example, the core layer 90 may form the first cut field gate core 10C, the first fin gate core 40C, the second fin gate core 50C, the butting gate core 60C, and the fin active core 130C, which fill the first field gate cut space S1, the fin gate cut space S3, the fin active cut space S4, the fin active recess 130R, by removing portions of the core layer 90 formed on the first mask pattern M1 or the first interlayer insulating layer 171.

Figure 9A:
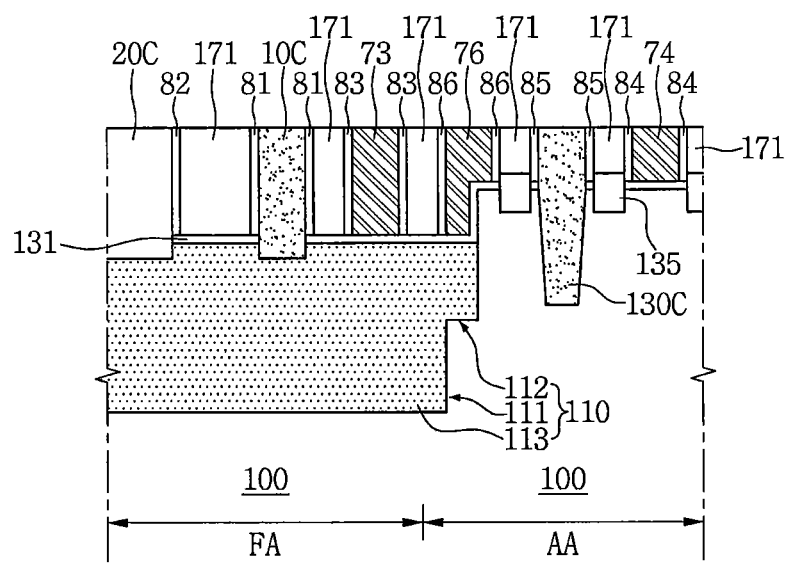
Figure 9B:
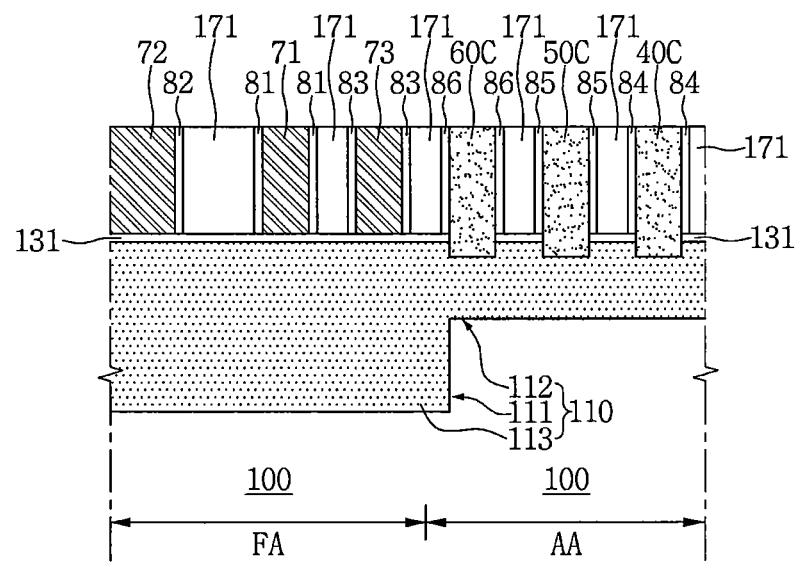
Figure 9C:
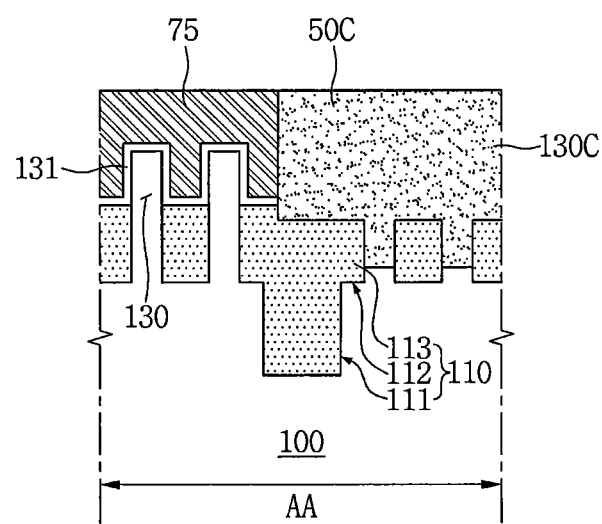

Referring to FIGS. 9A to 9C, the method may include forming silicon oxide, removing the first mask pattern M1 and exposing the sacrificial gate patterns 71 to 76 by performing a planarization process such as a CMP process.

Upper surfaces of the remaining sacrificial gate patterns 71 to 76, the first interlayer insulating layer 171, the gate spacers 81 to 86, the first cut field gate core 10C, the second cut field gate core 20C, the first and second fin gate cores 40C and 50C, the butting gate core 60C, and the fin active core 130C may be coplanar.

Figure 10A:
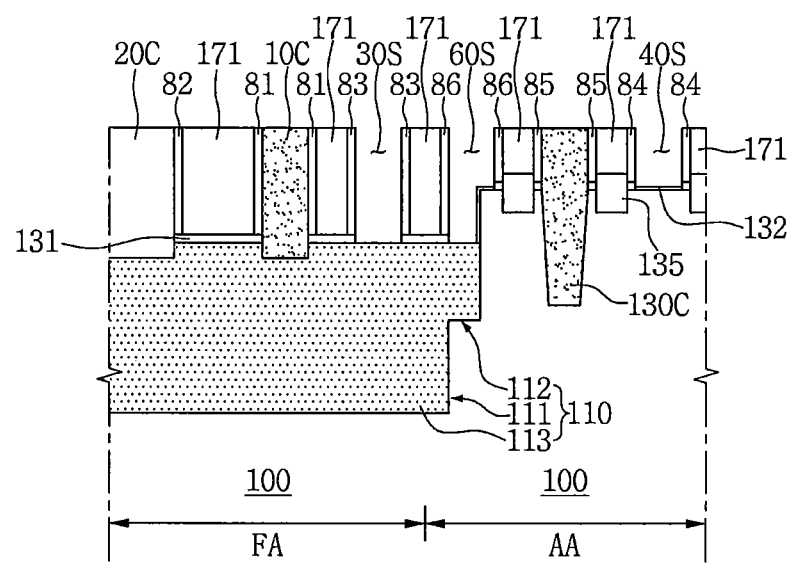
Figure 10B:
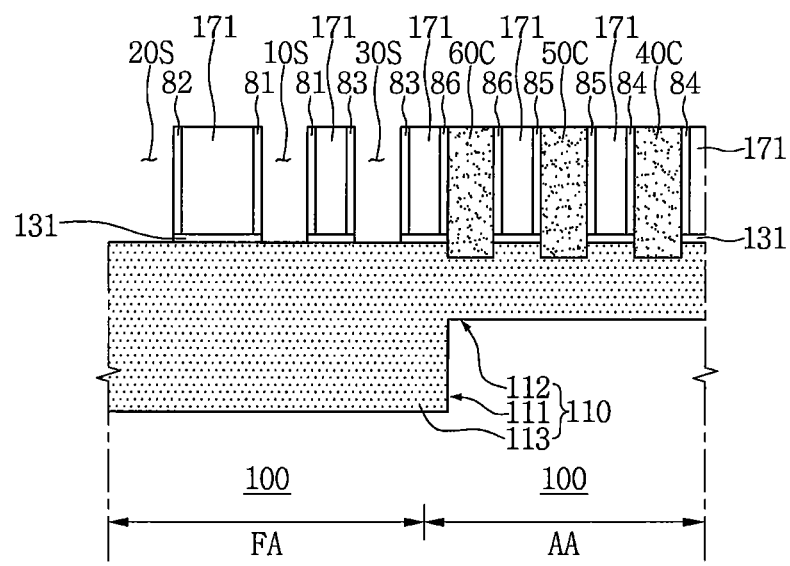
Figure 10C:
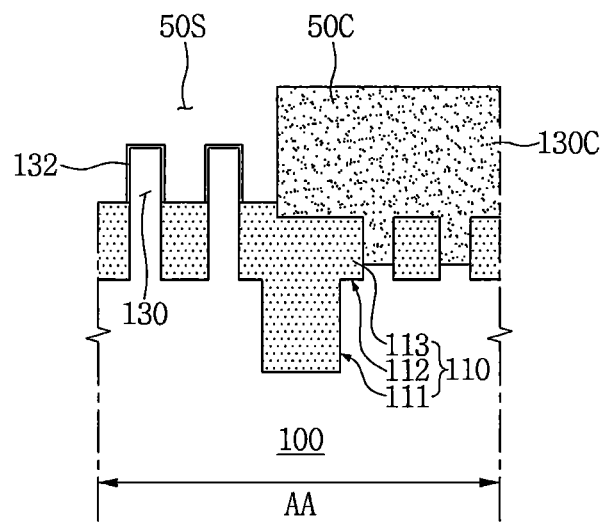

Referring to FIGS. 10A to 10C, the method may include forming gate electrode spaces 10S, 20S, 30S, 40S, 50S, and 60S by removing the exposed sacrificial gate patterns 71 to 76 by performing a silicon etching process, and forming a thin surface insulating layer 132 on the surface of the fin active region 130 exposed in the fin gate electrode spaces 40S, 50S, and 60S by performing a washing process or a wet oxidation process. Therefore, the surface insulating layer 132 may include oxidized silicon.

Figure 11A:
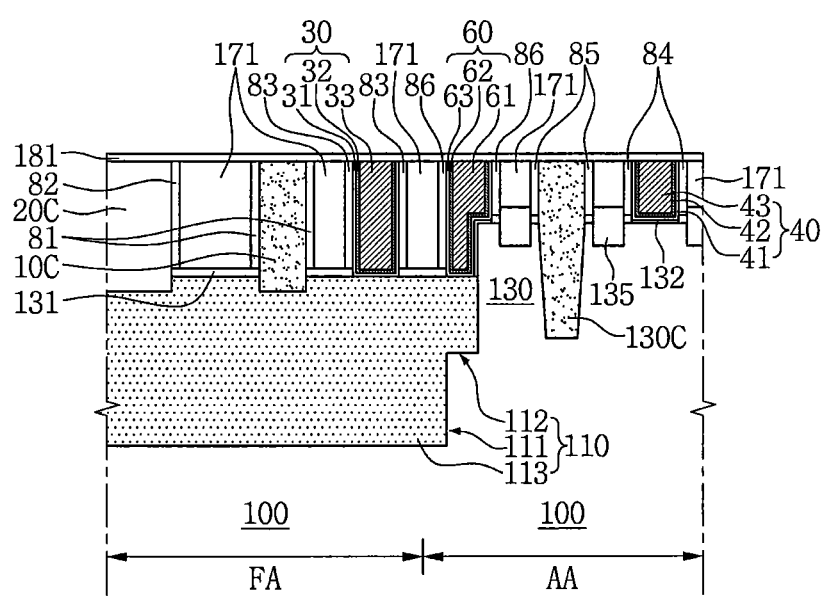
Figure 11B:
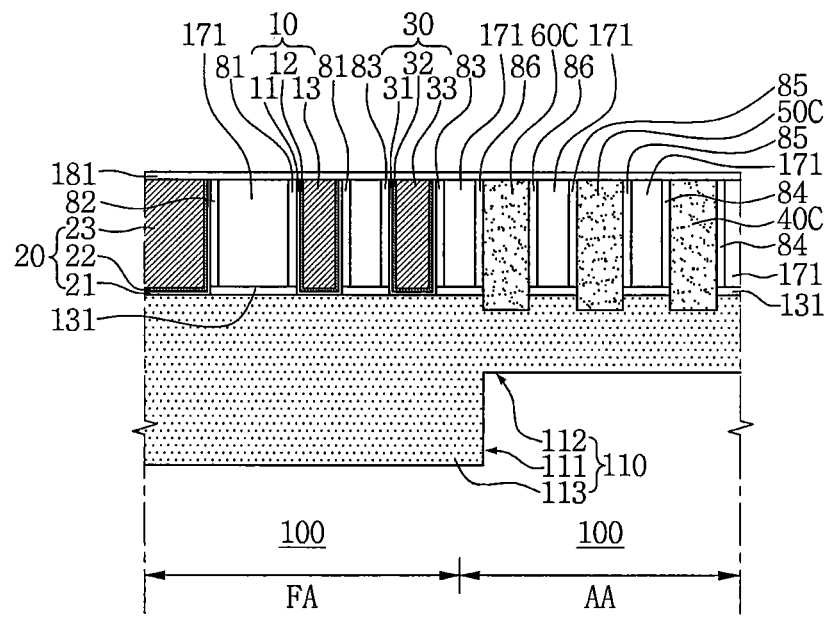
Figure 11C:
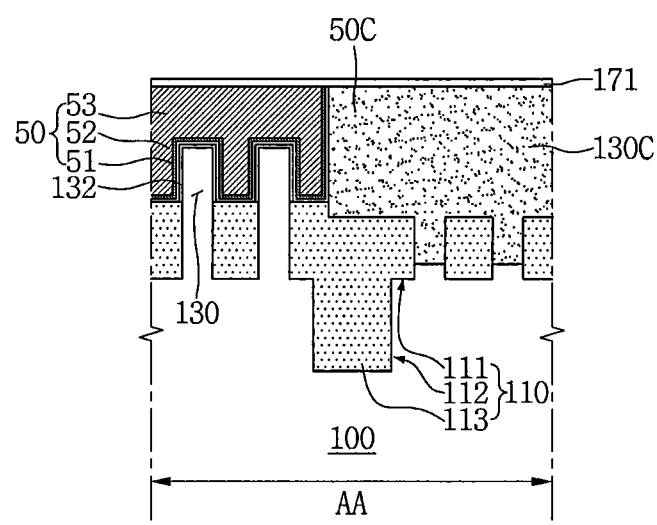

Referring to FIGS. 11A to 11C, the method may include forming gate patterns 10, 20, 30, 40, 50, and 60 in the gate electrode spaces 10S, 20S, 30S, 40S, 50S, and 60S, and forming a first stopper layer 181.

The gate patterns 10, 20, 30, 40, 50, and 60 may include gate insulating layers 11, 21, 31, 41, 51, and 61, gate barrier layers 12, 22, 32, 42, 52, and 62, and gate electrodes 13, 23, 33, 43, 53, and 63, respectively. The gate insulating layers 11, 21, 31, 41, 51, and 61 each may include a metal oxide such as hafnium oxide (HfO) or aluminum oxide (AlO). The gate barrier layers 12, 22, 32, 42, 52, and 62 each may include a barrier metal such as titanium nitride (TiN). The gate electrodes 13, 23, 33, 43, 53, and 63 each may include a metal compound or a metal alloy including tungsten (W), titanium (Ti), tantalum (Ta), aluminum (Al) and/or nitrogen (N).

The gate insulating layers 11, 21, 31, 41, 51, and 61 each may be formed in a "U" shape on the isolation region 110, the surface insulating layer 132, and the gate spacers 81 to 86. The gate barrier layers 12, 22, 32, 42, 52, and 62 each may be formed in a "U" shape on the gate insulating layers 11, 21, 31, 41, 51, and 61. The gate electrodes 13, 23, 33, 43, 53, and 63 each may be solid and may be surrounded by the gate barrier layers 12, 22, 32, 42, 52, and 62. The first stopper layer 181 may have a flat upper surface. The first stopper layer 181 may include silicon nitride.

Figure 12A:
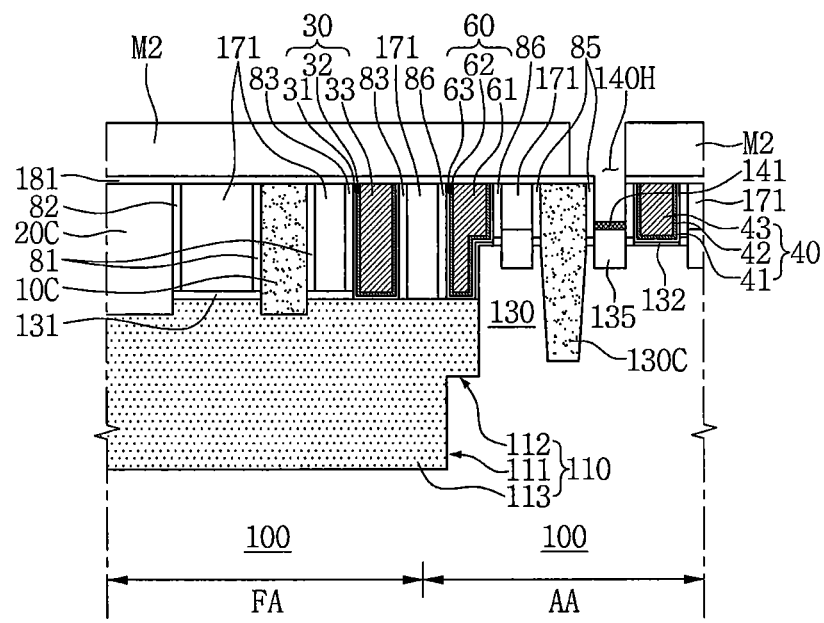
Figure 12B:
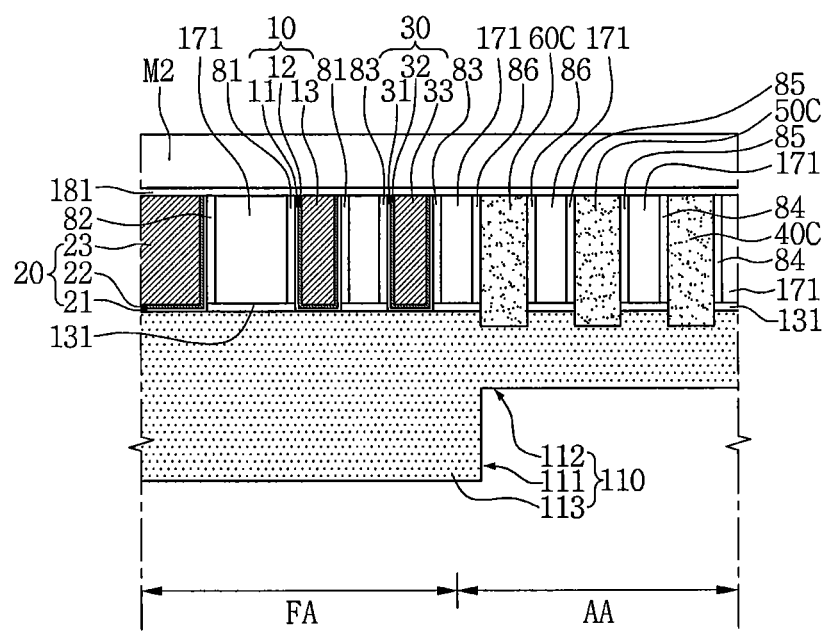
Figure 12C:
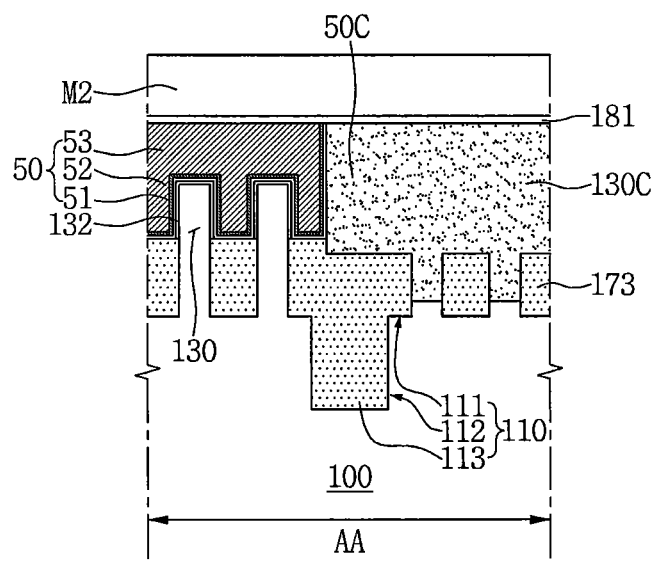

Referring to FIGS. 12A to 12C, the method may include forming a second mask pattern M2 on the first stopper layer 181, forming a contact hole 140H which exposes the source/drain region 135 by etching the first stopper layer 181 and the first interlayer insulating layer 171 by performing an etching process using the second mask pattern M2 as an etch mask, and forming a silicide layer 141 on the exposed source/drain region 135.

Since the fin active core 130C is present, the second mask pattern M2 may be formed wider than the contact hole 14011 and thus a align margin may be increased.

The forming of the silicide layer 141 may include siliciding a surface of the exposed source/drain region 135 by performing a silicidation process. Therefore, the silicide layer 141 may include titanium silicide (TiSi), tungsten silicide (WSi), nickel silicide (NiSi), cobalt silicide (CoSi) or another metal silicide. The second mask pattern M2 may include a photoresist or polysilicon. Then, the second mask pattern M2 may be removed.

Figure 13A:
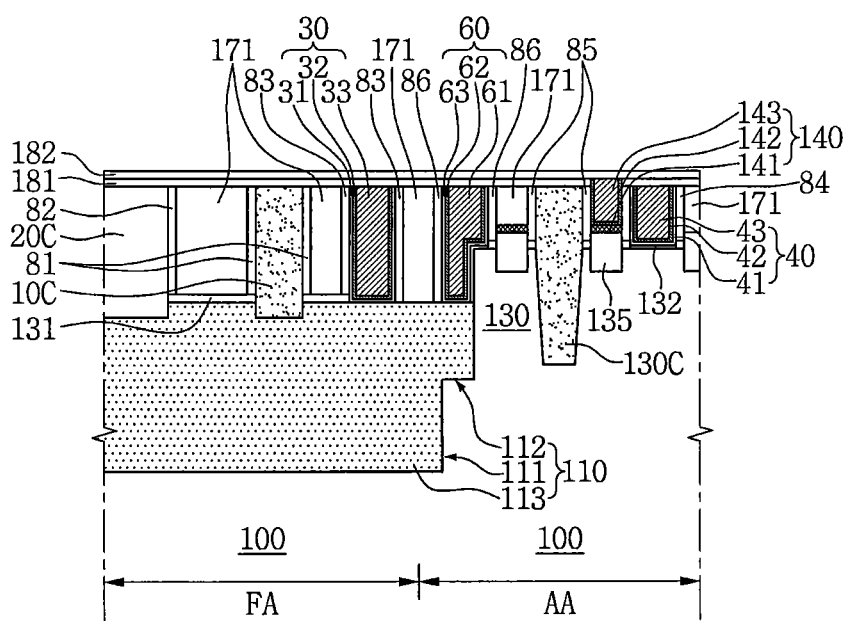
Figure 13B:
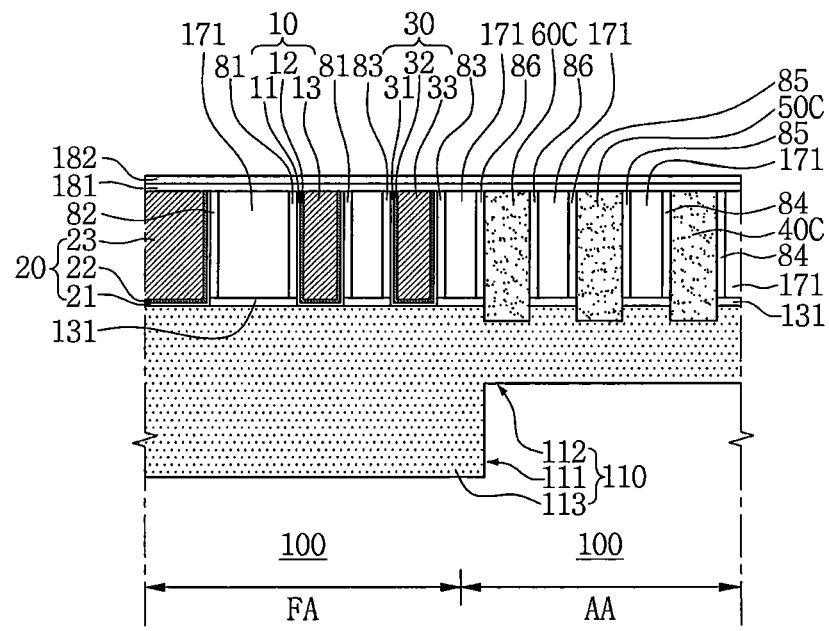
Figure 13C:
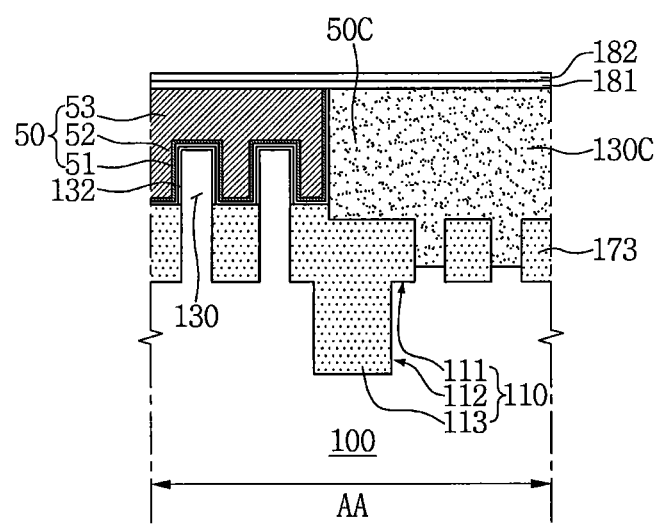

Referring to FIGS. 13A to 13C, the method may include forming a contact pattern 140 in the contact hole 140H using a CMP process, and forming a second stopper layer 182 on the contact pattern 140.

The contact pattern 140 may include a contact barrier layer 142 and a contact plug 143. The contact barrier layer 142 may include a barrier metal compound such as titanium nitride (TiN). The contact plug 143 may include a metal such as tungsten (W). The second stopper layer 182 may include silicon nitride.

The contact pattern 140 may be formed through a self-align method. For example, when the CMP process is performed, the fin active core 130C may be used as a planarization stop layer even when the first stopper layer 181 is removed. Further, even when the gate electrodes 13, 23, 33, 43, 53, and 63 of the gate patterns 10, 20, 30, 40, 50, and 60 are exposed by removing the first stopper layer 181, the second stopper layer 182 may reduce physical and chemical damage to the gate electrodes 13, 23, 33, 43, 53, and 63.

Figure 14A:
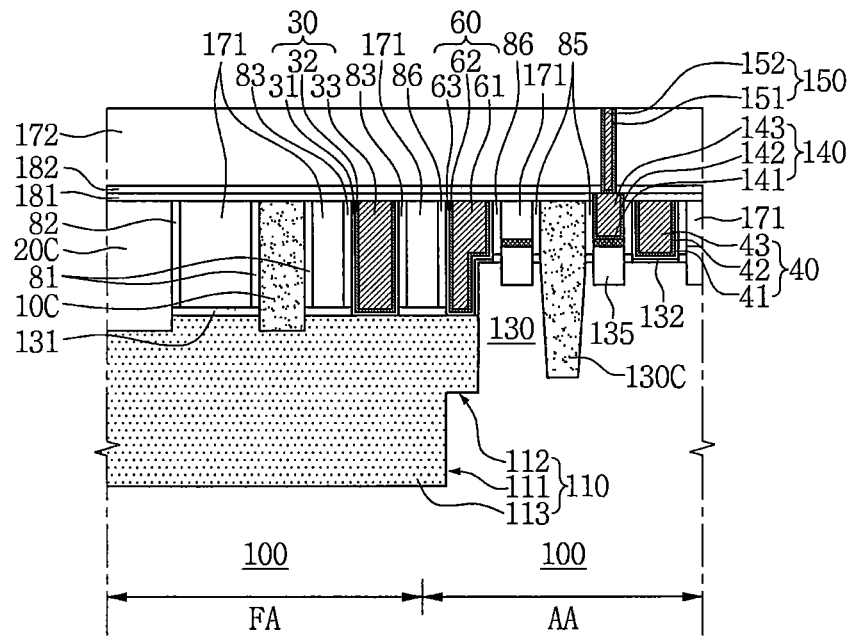
Figure 14B:
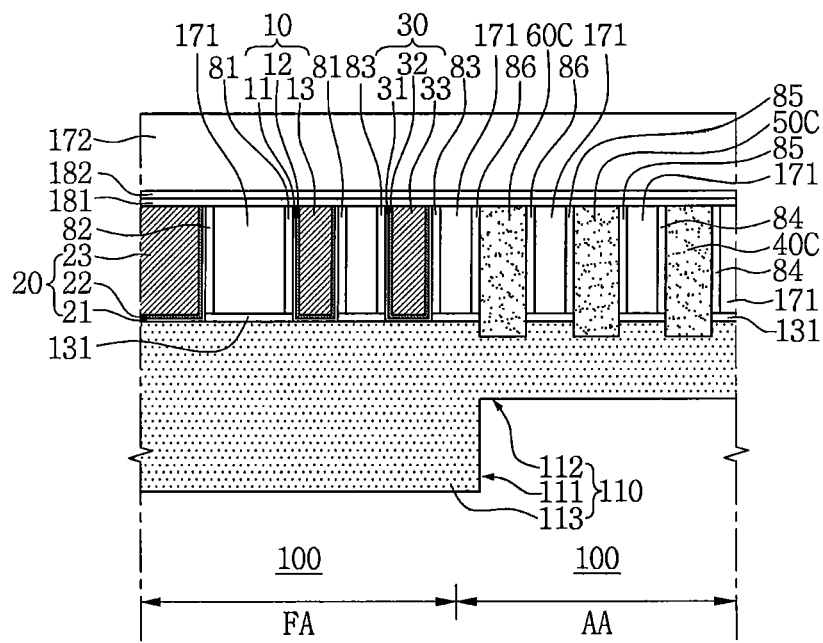
Figure 14C:
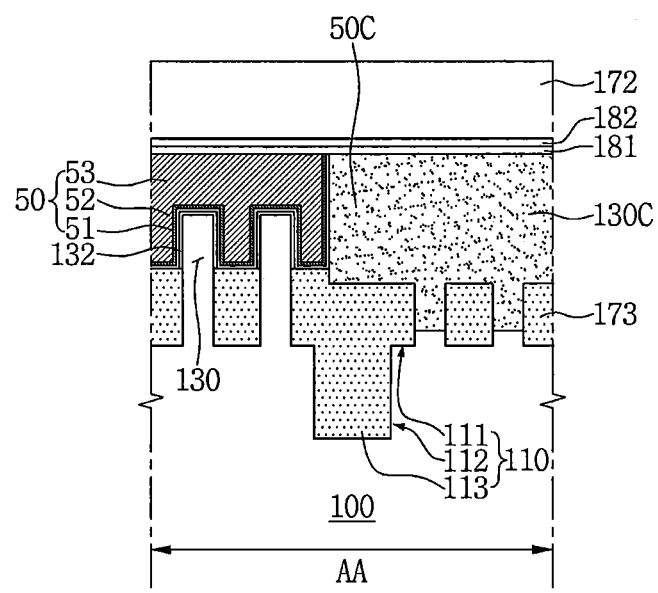

Referring to FIGS. 14A to 14C, the method may include forming a second interlayer insulating layer 172 on the second stopper layer 182, and forming a via pattern 150 that connects to the contact pattern 140 and vertically extends through the second interlayer insulating layer 172. The second interlayer insulating layer 172 may include silicon oxide.

The via pattern 150 may include a via barrier layer 151 and a via plug 152. The via barrier layer 151 may include a barrier metal compound such as titanium nitride (TiN). The via plug 152 may include a metal such as tungsten (W).

Then, as described with reference to FIGS. 2A to 2C, the method may include forming a metal interconnection 160 on the via pattern 150, and forming a third interlayer insulating layer 173 which covers the metal interconnection 160.

The metal interconnection 160 may horizontally extend. The metal interconnection 160 may include a metal such as tungsten (W). The third interlayer insulating layer 173 may include silicon oxide or silicon nitride. A stopper layer may be further formed between the second interlayer insulating layer 172 and the third interlayer insulating layer 173.

Figure 15A:
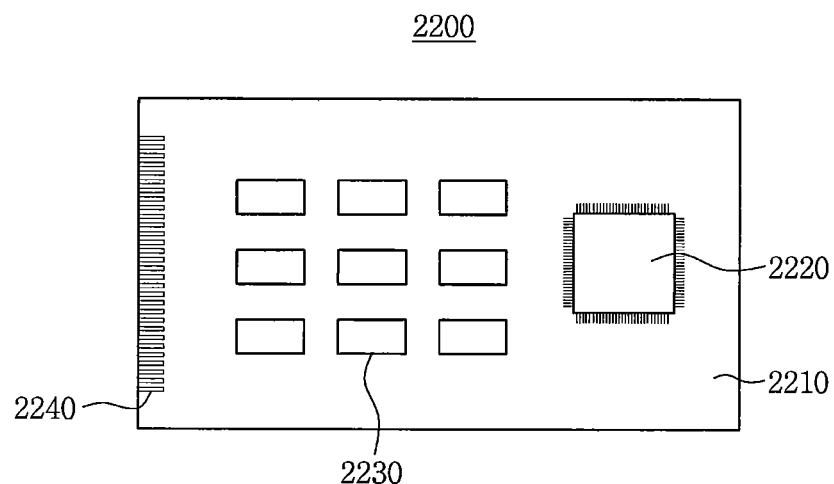
FIG. 15A is a diagram illustrating a semiconductor module in accordance with some embodiments of the inventive concept.

FIG. 15A is a diagram illustrating a semiconductor module 2200 in accordance with some embodiments of the inventive concept. Referring to FIG. 15A, the semiconductor module 2200 in accordance with some embodiments of the inventive concept may include a processor 2220 and semiconductor devices 2230, which are mounted on a module substrate 2210. The processor 2220 or the semiconductor devices 2230 may include a semiconductor device in accordance with some embodiments of the inventive concept. Conductive input/output terminals 2240 may be disposed on at least one side of the module substrate 2210.

Figure 15B:
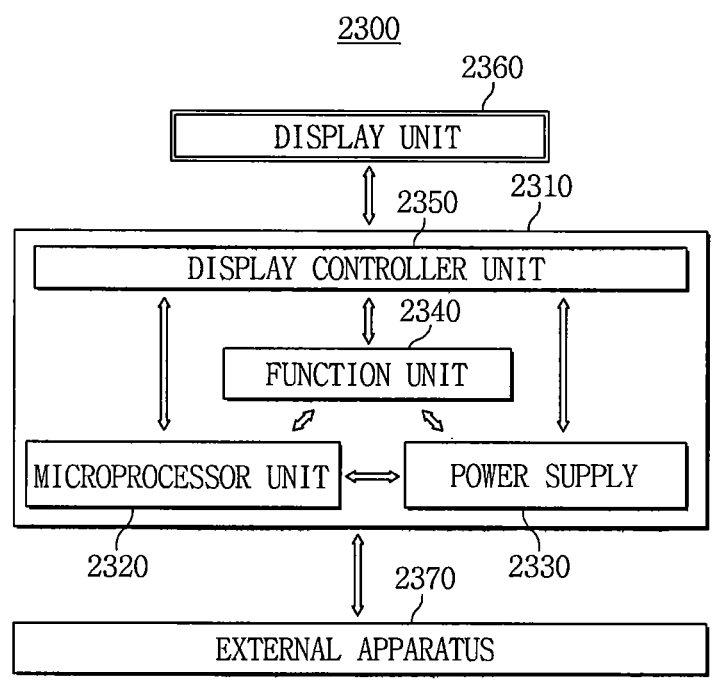
FIGS. 15B and 15C are block diagrams illustrating electronic systems in accordance with some embodiments of the inventive concept.

FIG. 15B is a block diagram illustrating an electronic system 2300 in accordance with some embodiments of the inventive concept. Referring to FIG. 15B, the electronic system 2300 in accordance with some embodiments of the inventive concept may include a body 2310, a display unit 2360, and an external apparatus 2370. The body 2310 may include a microprocessor unit 2320, a power supply 2330, a function unit 2340, and/or a display controller unit 2350. The body 2310 may include a system board or a motherboard having a PCB or the like, and/or a case. The microprocessor unit 2320, the power supply 2330, the function unit 2340, and the display controller unit 2350 may be mounted or disposed on an upper surface of the body 2310 or inside the body 2310. The display unit 2360 may be disposed on the upper surface of the body 2310 or inside/outside the body 2310. The display unit 2360 may display an image processed by the display controller unit 2350. For example, the display unit 2360 may include a liquid crystal display (LCD), active matrix organic light emitting diodes (AMOLED), or various display panels. The display unit 2360 may include a touch screen. Therefore, the display unit 2360 may have an input/output function. The power supply 2330 may supply a current or a voltage to the microprocessor unit 2320, the function unit 2340, the display controller unit 2350, etc. The power supply 2330 may include a charging battery, a socket for a dry cell, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch pad, a touch screen, a volatile/non-volatile memory, a memory card controller, a camera, a lighting, an audio and moving picture playback processor, a wireless radio antenna, a speaker, a microphone, a USB port, or a unit having other various functions. The microprocessor unit 2320 or the function unit 2340 may include a semiconductor device in accordance with some embodiments of the inventive concept.

Figure 15C:
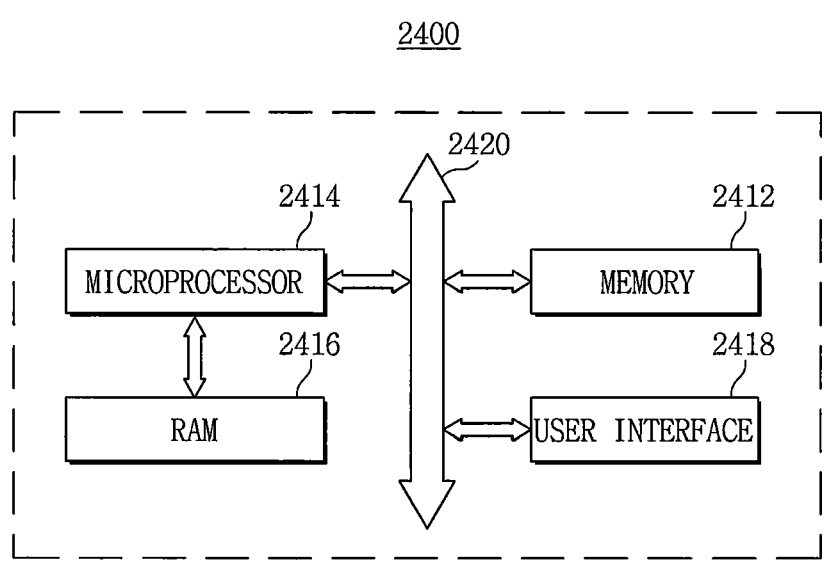

Referring to FIG. 15C, an electronic system 2400 in accordance with some embodiments of the inventive concept may include a microprocessor 2414, a memory 2412, and a user interface 2418 which perform data communication using a bus 2420. The microprocessor 2414 may include a CPU or an AP. The electronic system 2400 may further include a RAM 2416 in direct communication with the microprocessor 2414. The microprocessor 2414 and/or the RAM 2416 may be assembled within a single package. The user interface 2418 may be used to input data to the electronic system 2400, or output data from the electronic system 2400. For example, the user interface 2418 may include a touch pad, a touch screen, a keyboard, a mouse, a scanner, a voice detector, a cathode ray tube (CRT) monitor, an LCD, an AMOLED, a plasma display pad (PDP), a printer, a lighting, or various input/output devices. The memory 2412 may store operational codes of the microprocessor 2414, data processed by the microprocessor 2414, or data received from the outside. The memory 2412 may include a memory controller, a hard disk, or a solid state drive (SSD). The microprocessor 2414, the RAM 2416, and/or the memory 2412 may include a semiconductor device in accordance with some embodiments of the inventive concept.

Semiconductor devices and methods of fabricating the same in accordance with some embodiments of the inventive concept, a single diffusion break (SDB) structure can be implemented using a fin active cutting method.

Semiconductor devices and methods of fabricating the same in accordance with some embodiments of the inventive concept, a fin active region and a gate pattern are concurrently cut, and the methods thus can be simplified.

Semiconductor devices and methods of fabricating the same in accordance with some embodiments of the inventive concept, an insulation material is formed in a recess in a fin active region adjacent a contact pattern, and the contact pattern thus can be formed by a self-aligned process.

Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims.

What is claimed is:

1. A method of fabricating a semiconductor device, comprising:
   forming an isolation region defining a fin active region on a substrate;
   forming a sacrificial field gate pattern on the isolation region and forming a sacrificial fin gate pattern on the fin active region;
   forming a first interlayer insulating layer between the sacrificial field gate pattern and the sacrificial fin gate pattern;
   forming a field gate cut zone comprising a first recess exposing a surface of the isolation region by removing a first portion of the sacrificial field gate pattern and a fin active cut zone comprising a second recess exposing a surface of the fin active region by removing a first portion of the sacrificial fin gate pattern;
   forming a fin active recess by removing the fin active region exposed in the second recess of the fin active cut zone;
   forming a field gate core and a fin active core by forming an insulation material in the first recess of the field gate cut zone and the fin active recess, respectively;
   forming a field gate electrode opening by removing a second portion of the sacrificial field gate pattern and forming a fin gate electrode opening by removing a second portion of the sacrificial fin gate pattern; and
   forming a field gate pattern in the field gate electrode opening and forming a fin gate pattern in the fin gate electrode opening.

2. The method of claim 1, further comprising forming a base insulating layer between the fin active region and the sacrificial fin gate pattern using a deposition process.

3. The method of claim 1, wherein the forming of the isolation region comprises:
   forming a trench comprising a deep trench and a shallow trench in the substrate; and
   forming a trench insulation material filling the deep trench and partially filling the shallow trench.

4. The method of claim 1, wherein the sacrificial field gate pattern and the sacrificial fin gate pattern comprise polysilicon, the first interlayer insulating layer comprises silicon oxide, and the field gate core and the fin active core comprise silicon nitride.

5. The method of claim 1, further comprising:
   forming a fin gate cut zone comprising a third recess by removing a third portion of the sacrificial fin gate pattern; and
   forming a fin gate core by forming the insulation material in the third recess of the fin gate cut zone.

6. The method of claim 1, further comprising:
   forming a sacrificial dummy gate pattern on the isolation region;
   forming a dummy gate electrode opening by removing the sacrificial dummy gate pattern; and
   forming a dummy gate pattern in the dummy gate electrode opening.

7. The method of claim 1, further comprising:
   forming a sacrificial butting gate pattern overlapping both the isolation region and the fin active region;
   forming a butting gate electrode opening by removing the sacrificial butting gate pattern; and forming a butting gate pattern in the butting gate electrode opening.

8. The method of claim 1, further comprising:
forming a source/drain region in the fin active region adjacent the fin gate pattern;
forming a contact pattern extending through the first interlayer insulating layer and connecting to the source/drain region;
forming a second interlayer insulating layer on the contact pattern; and
forming a via pattern extending through the second interlayer insulating layer and connecting to the contact pattern.

9. The method of claim 8, wherein the forming of the source/drain region comprises performing an epitaxial growth process, and wherein the contact pattern comprises a silicide layer directly on the source/drain region, a contact barrier layer on the silicide layer, and a contact plug on the contact barrier layer.

10. A method of fabricating a semiconductor device, comprising:
forming an isolation region in a substrate, the substrate comprising a field area and an active area, and the isolation region defining a fin active region in the active area;
forming a sacrificial first field gate pattern on the isolation region of the field area and forming a sacrificial first fin gate pattern and a sacrificial second fin gate pattern on the fin active region and the isolation region of the active area;
forming a first field gate cut zone comprising a first recess exposing the isolation region by removing a portion of the sacrificial first field gate pattern and a fin gate cut zone comprising a second recess exposing the fin active region by removing a portion of the sacrificial second fin gate pattern;
forming a fin active recess by removing a portion of the fin active region exposed in the second recess of the fin gate cut zone;
forming a first field gate core, a fin gate core, and a fin active core in the first recess of the first field gate cut zone, the second recess of the fin gate cut zone, and the fin active recess, respectively, wherein the first field gate core, the fin gate core, and the fin active core comprise the same material;
forming a first fin gate electrode opening by removing a portion of the sacrificial first fin gate pattern; and
forming a first fin gate pattern in the first fin gate electrode opening.

11. The method of claim 10, further comprising:
forming a sacrificial second field gate pattern on the isolation region of the field area;
forming a second field gate cut zone comprising a third recess by removing a portion of the sacrificial second field gate pattern; and
forming a second field gate core in the third recess of the second field gate cut zone.

12. The method of claim 11, wherein the first field gate core, the fin gate core, and the fin active core comprise silicon nitride, and the second field gate core comprises silicon oxide.

13. The method of claim 10, further comprising:
forming a sacrificial dummy field gate pattern on the isolation region of the field area;
forming a dummy field gate electrode opening by removing the sacrificial dummy field gate pattern; and
forming a dummy field gate pattern in the dummy field gate electrode opening.

14. The method of claim 10, further comprising:
forming a sacrificial butting gate pattern on the isolation region and the fin active region of the active area;
forming a butting gate electrode opening by removing the sacrificial butting gate pattern; and
forming a butting gate pattern in the butting gate electrode opening.

15. The method of claim 10, wherein upper surfaces of the first field gate core, the fin gate core, the fin active core, and the first fin gate pattern are coplanar.

16. A method of fabricating a semiconductor device, comprising:
forming a fin active region in a first region of a substrate, the substrate comprising the first region and a second region;
forming an isolation region in the first region and the second region of the substrate, the isolation region being adjacent the fin active region;
forming a first gate line in the first region of the substrate, the first gate line traversing the fin active region and extending on the isolation region;
forming a second gate line extending on the isolation region in the second region of the substrate;
concurrently removing a portion of the first gate line disposed on the fin active region to form a first recess in the first gate line and a portion of the second gate line to form a second recess in the second gate line;
removing a portion of the fin active region exposed by the first recess of the first gate line to form a third recess in the fin active region; and
forming a first insulating core pattern in the first and third recesses and a second insulating core pattern in the second recess.

17. The method of claim 16, further comprising:
forming a third gate line in the first region of the substrate, the third gate line traversing the fin active region and the isolation region;
removing a portion of the third gate line disposed on the isolation region to form a fourth recess in the third gate line concurrently with removing the portion of the first gate line to form the first recess and the portion of the second gate line to form the second recess; and
forming a third insulating core pattern in the third recess.

18. The method of claim 17, wherein upper surfaces of the first, second and third insulating core patterns are coplanar.

19. The method of claim 16, wherein the first and second insulating core patterns comprise silicon nitride.

20. The method of claim 16, further comprising forming a source/drain region in the fin active region adjacent a side of the first gate line before concurrently removing the portion of the first gate line and the portion of the second gate line.

* * * * *